(12) United States Patent
Izumi et al.

(10) Patent No.: US 10,256,609 B2
(45) Date of Patent: Apr. 9, 2019

(54) SURFACE LIGHT-EMITTING LASER

(71) Applicant: Sony Corporation, Tokyo (JP)

(72) Inventors: Shoichiro Izumi, Kanagawa (JP);
Tatsushi Hamaguchi, Kanagawa (JP);
Noriyuki Futagawa, Kanagawa (JP);
Masaru Kuramoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/758,674

(22) PCT Filed: Aug. 18, 2016

(86) PCT No.: PCT/JP2016/074074
§ 371 (c)(1),
(2) Date: Mar. 8, 2018

(87) PCT Pub. No.: WO2017/047317
PCT Pub. Date: Mar. 23, 2017

(65) Prior Publication Data
US 2018/0248339 A1    Aug. 30, 2018

(30) Foreign Application Priority Data

Sep. 15, 2015  (JP) .................................. 2015-181627

(51) Int. Cl.
*H01S 5/187*    (2006.01)
*H01S 5/026*    (2006.01)
*H01S 5/183*    (2006.01)
(Continued)

(52) U.S. Cl.
CPC .............. *H01S 5/187* (2013.01); *H01S 5/026* (2013.01); *H01S 5/183* (2013.01);
(Continued)

(58) Field of Classification Search
CPC .. H01S 5/187; H01S 5/18311; H01S 5/18388; H01S 5/34; H01S 5/026; H01S 5/343; H01S 5/183
See application file for complete search history.

(56) References Cited

U.S. PATENT DOCUMENTS 5,724,376 A * 3/1998 Kish, Jr. ............... H01S 5/0217
                                                            372/36
6,376,269 B1 * 4/2002 Chen .................. H01S 5/18341
                                                         372/50.11
(Continued)

FOREIGN PATENT DOCUMENTS

EP         1026798 A2    8/2000
JP       H10-39162 A     2/1998
(Continued)

OTHER PUBLICATIONS

International Search Report issued in connection with International Patent Application No. PCT/JP2016/074074, dated Nov. 1, 2016. (2 pages).

*Primary Examiner* — Xinning(Tom) Niu
(74) *Attorney, Agent, or Firm* — K&L Gates LLP

(57) ABSTRACT

A surface-emitting laser according to one embodiment of the technology includes a laser element section that includes a first multi-layer film reflecting mirror, a first semiconductor layer of a first conductivity type, an active layer, a second semiconductor layer of a second conductivity type, a second multi-layer film reflecting mirror, a nitride semiconductor layer of the second conductivity type, and a light output surface in this order. The laser element section further includes an electrode that injects a current into the active layer.

14 Claims, 23 Drawing Sheets

(51) Int. Cl.
  *H01S 5/343*  (2006.01)
  *H01S 5/34*  (2006.01)

(52) U.S. Cl.
  CPC ...... *H01S 5/18311* (2013.01); *H01S 5/18388* (2013.01); *H01S 5/34* (2013.01); *H01S 5/343* (2013.01)

(56) References Cited

U.S. PATENT DOCUMENTS

| | | |
|---|---|---|
| 8,824,520 B2 | 9/2014 | Kondo et al. |
| 9,595,810 B2 | 3/2017 | Hamaguchi et al. |
| 9,893,492 B2 | 2/2018 | Hamaguchi et al. |
| 2010/0158067 A1* | 6/2010 | Nakatsuka ............ G02B 6/4206 372/50.124 |
| 2014/0112364 A1* | 4/2014 | Kondo ................ H01S 5/18358 372/45.01 |
| 2015/0146756 A1* | 5/2015 | Kawaguchi ............. H01L 33/04 372/45.012 |

FOREIGN PATENT DOCUMENTS

| | | |
|---|---|---|
| JP | 2000-252584 A | 9/2000 |
| JP | 2001-155366 A | 6/2001 |
| JP | 2001-284722 A | 10/2001 |
| JP | 2008-118037 A | 5/2008 |
| JP | 2010-045249 A | 2/2010 |
| JP | 2010-147359 A | 7/2010 |
| JP | 2012-049292 A | 3/2012 |
| JP | 2014-086565 A | 5/2014 |
| JP | 2015-035541 A | 2/2015 |
| JP | 2015-035542 A | 2/2015 |
| WO | 2014/006813 A1 | 1/2014 |

* cited by examiner

[ FIG. 1 ]
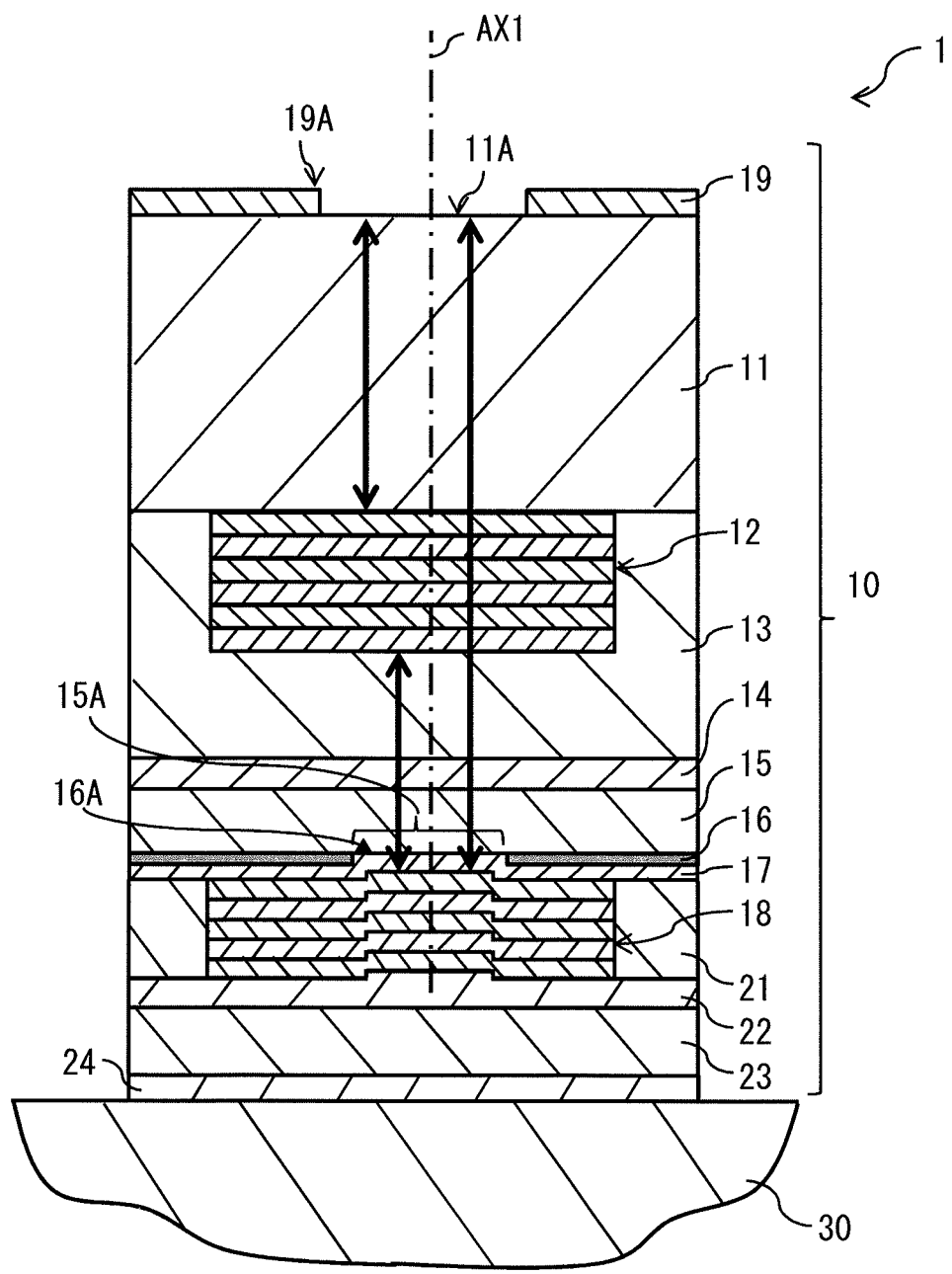

[ FIG. 2 ]
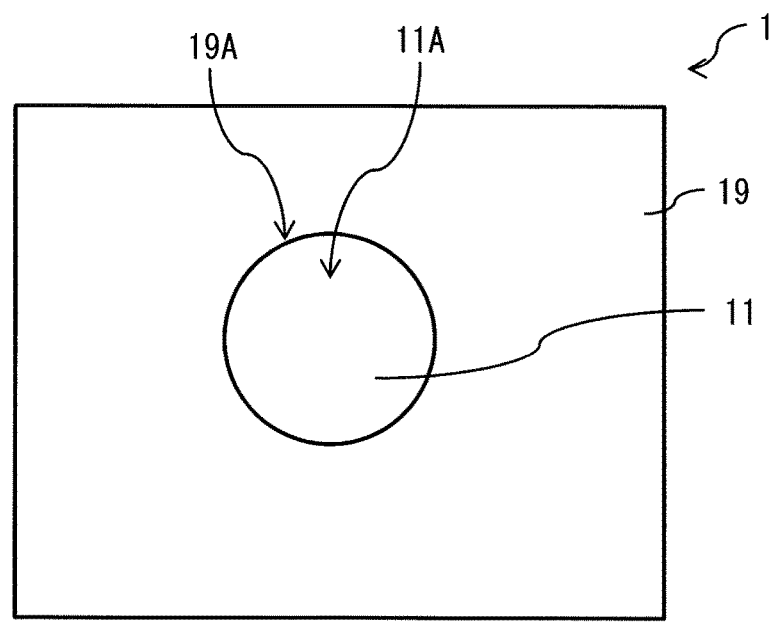
[ FIG. 3 ]
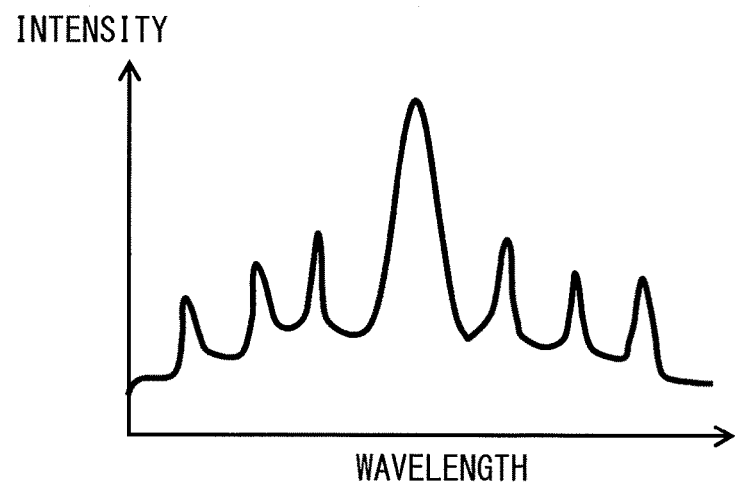

[ FIG. 4A ]
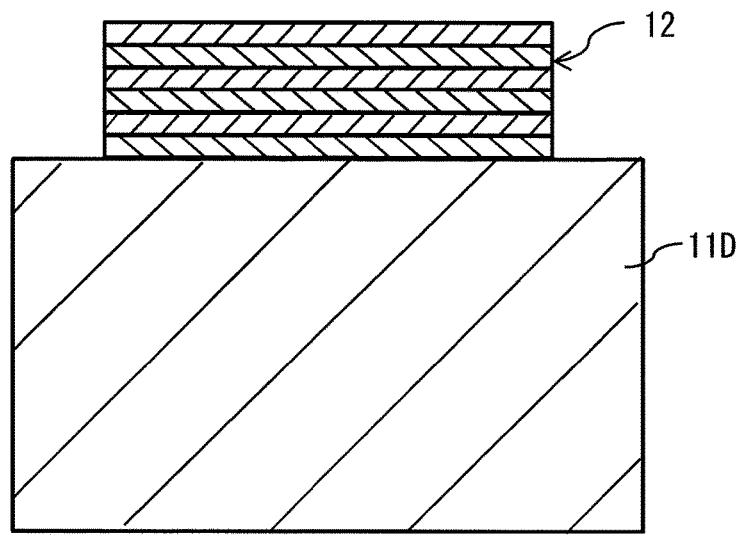
[ FIG. 4B ]
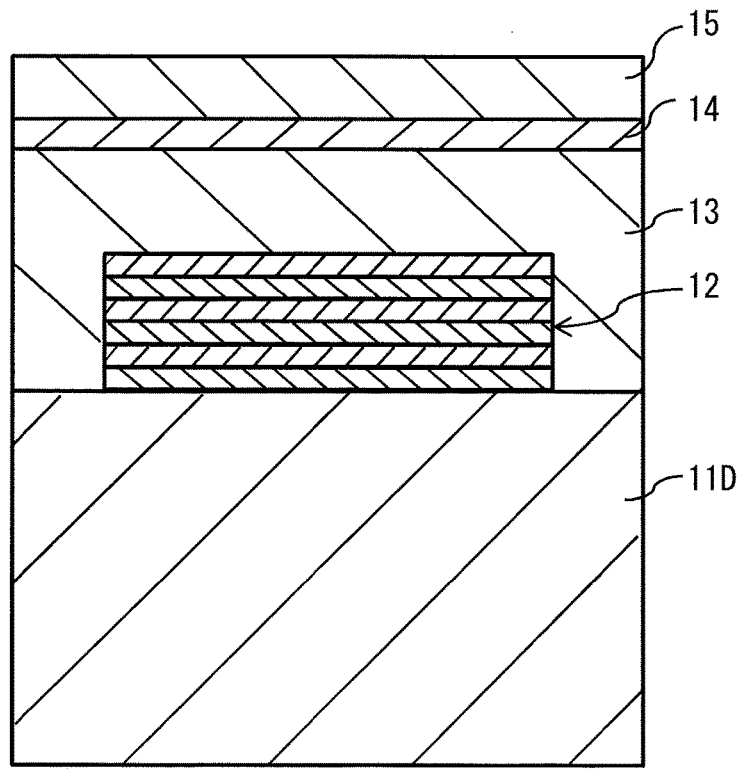

[ FIG. 4C ]
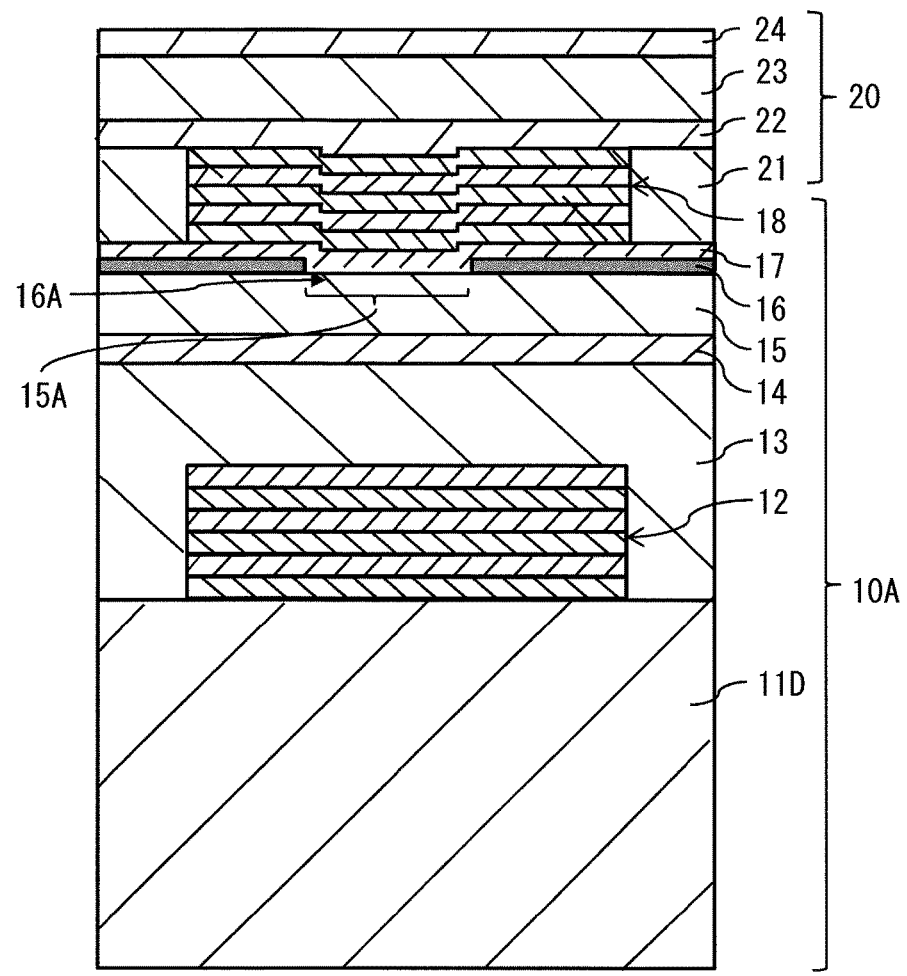

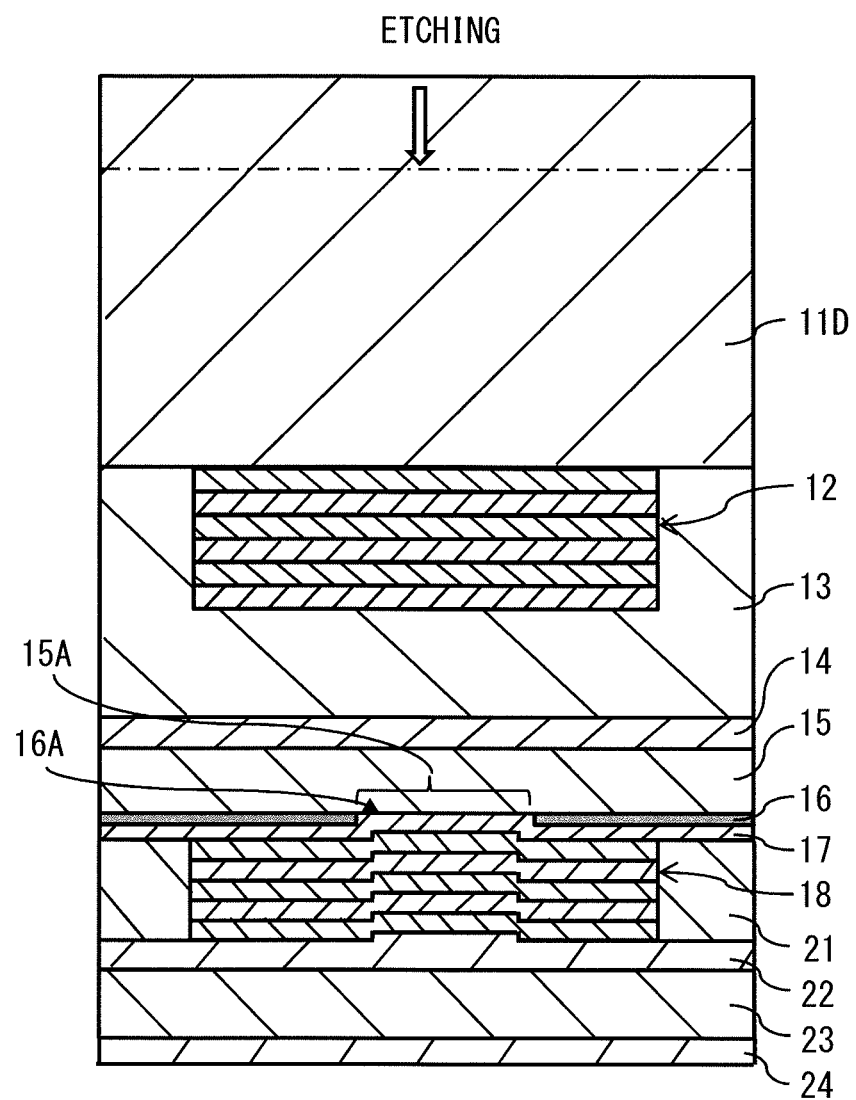
[ FIG. 4D ]

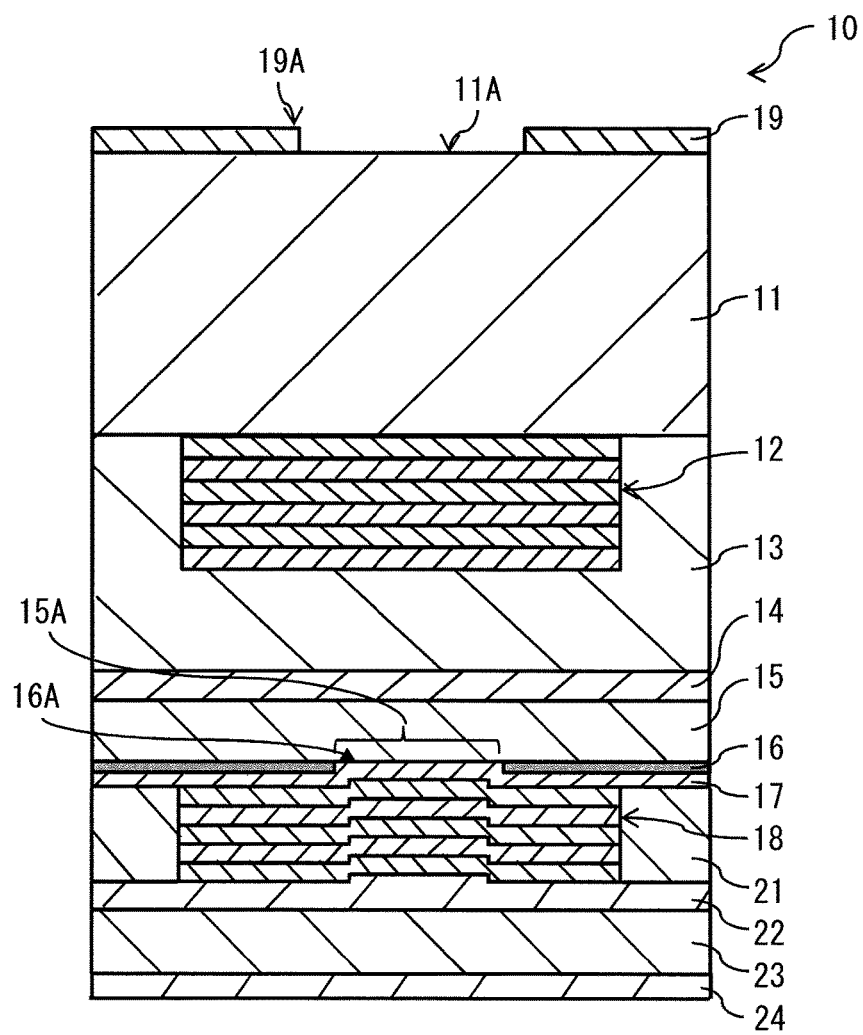
[ FIG. 4E ]

[ FIG. 5 ]
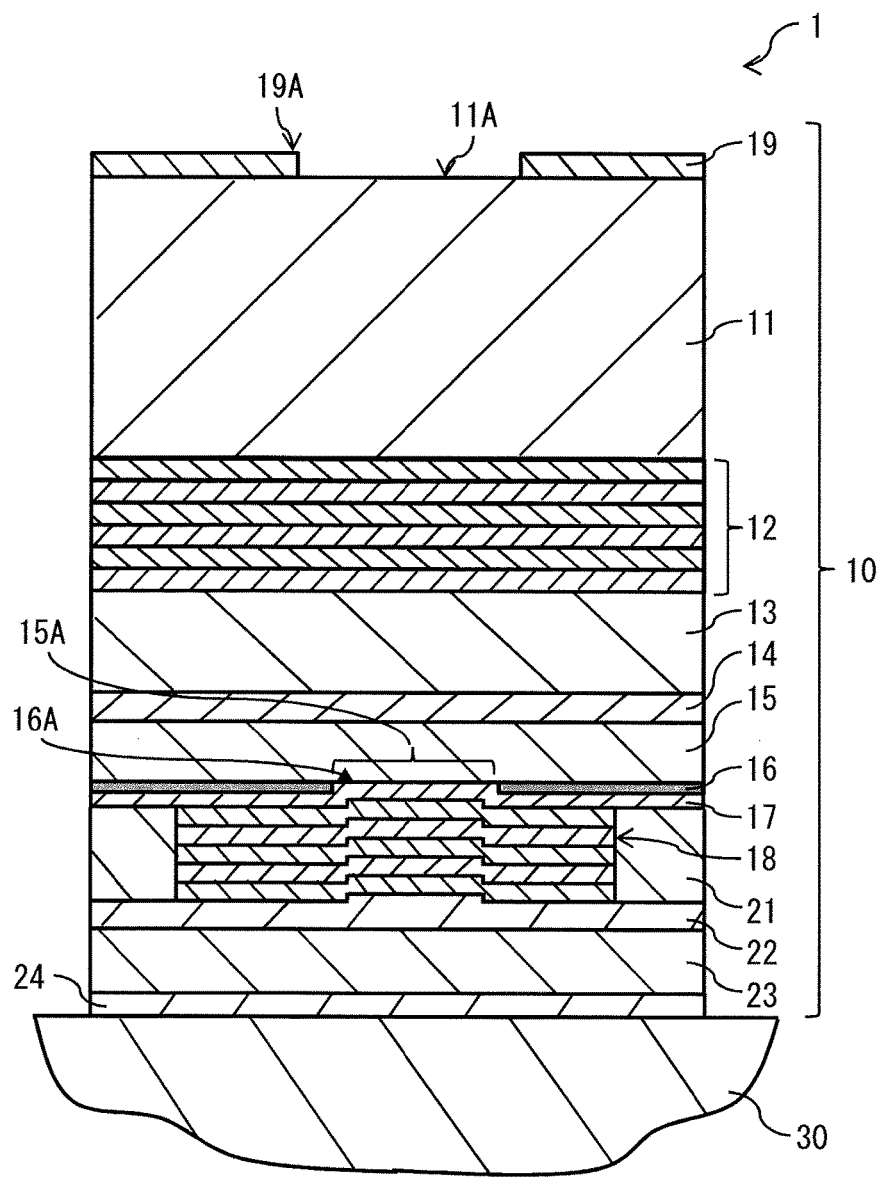

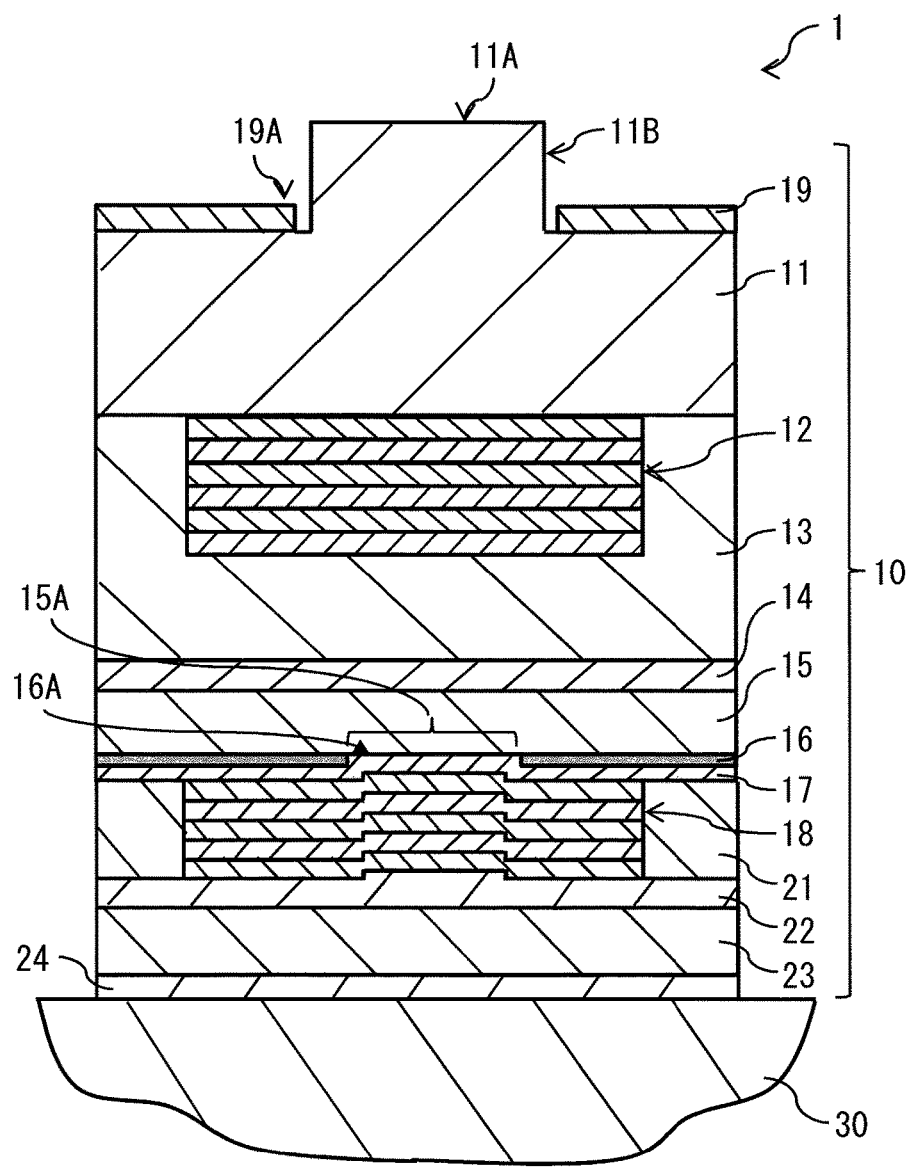
[FIG. 6]

[ FIG. 7 ]
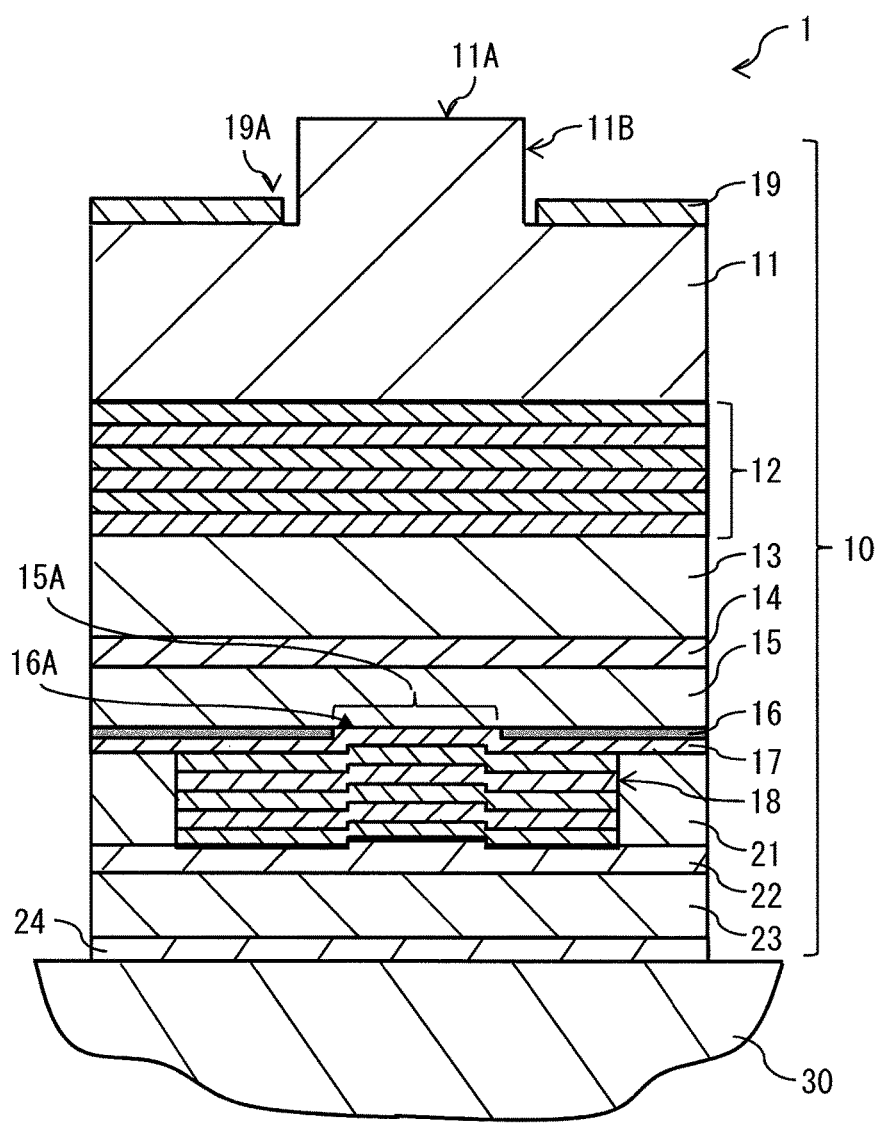

[ FIG. 8 ]
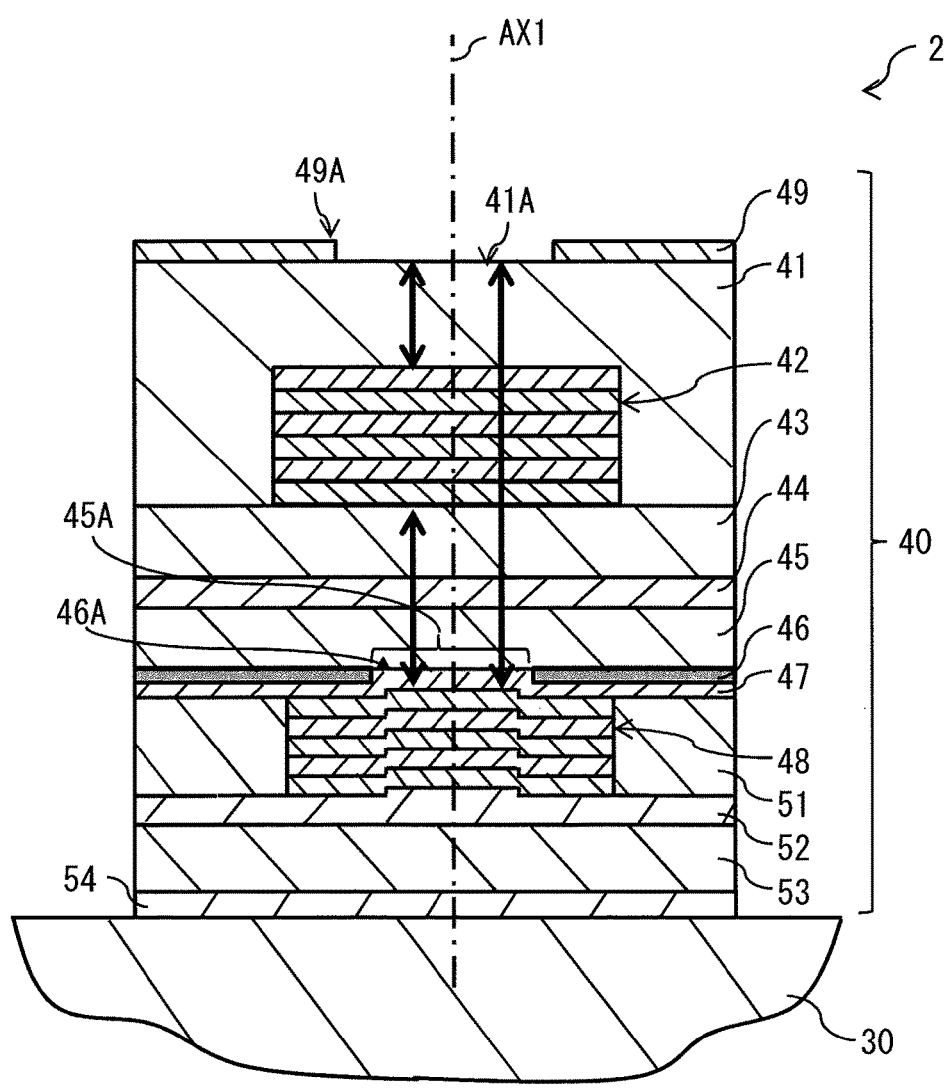

[ FIG. 9 ]
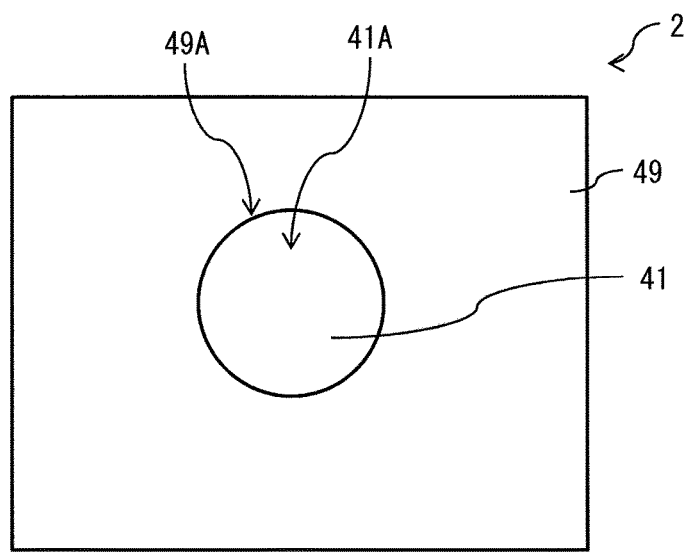
[ FIG. 10A ]
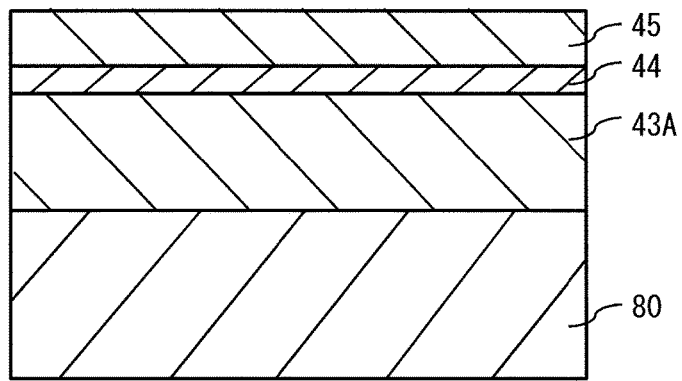

[ FIG. 10B ]
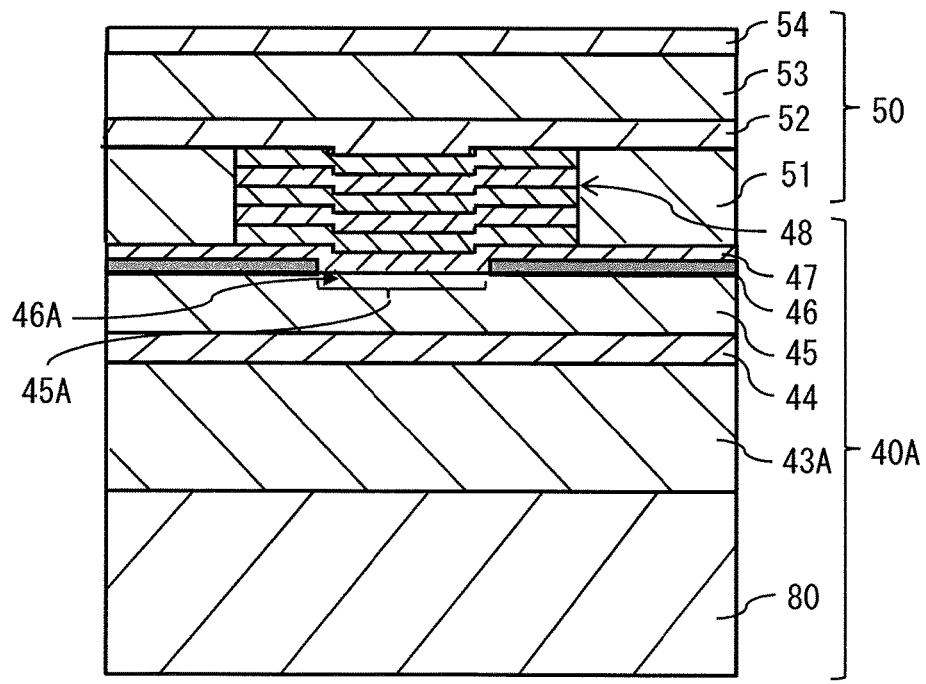
[ FIG. 10C ]
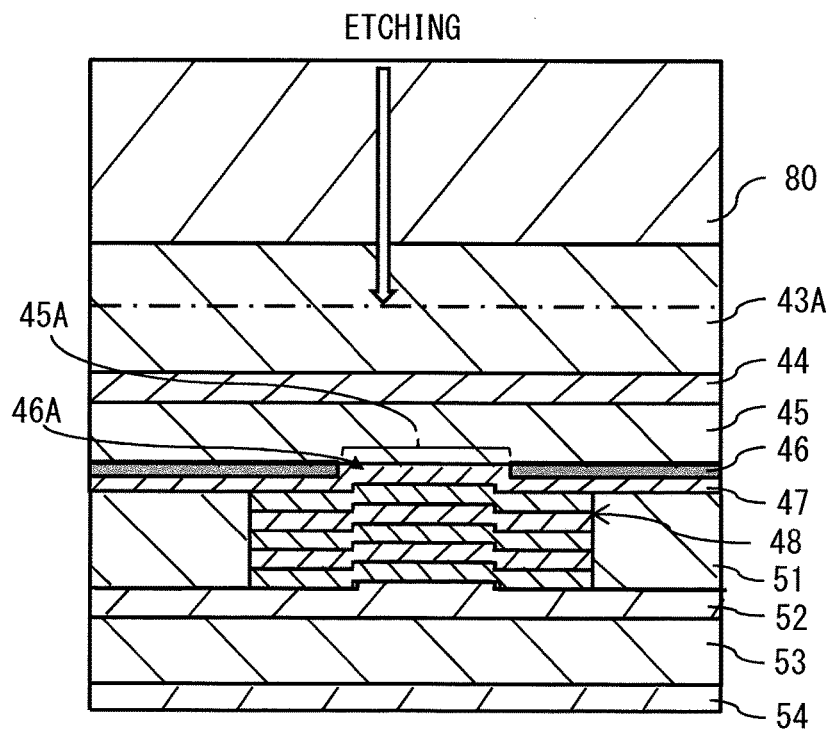

[ FIG. 10D ]
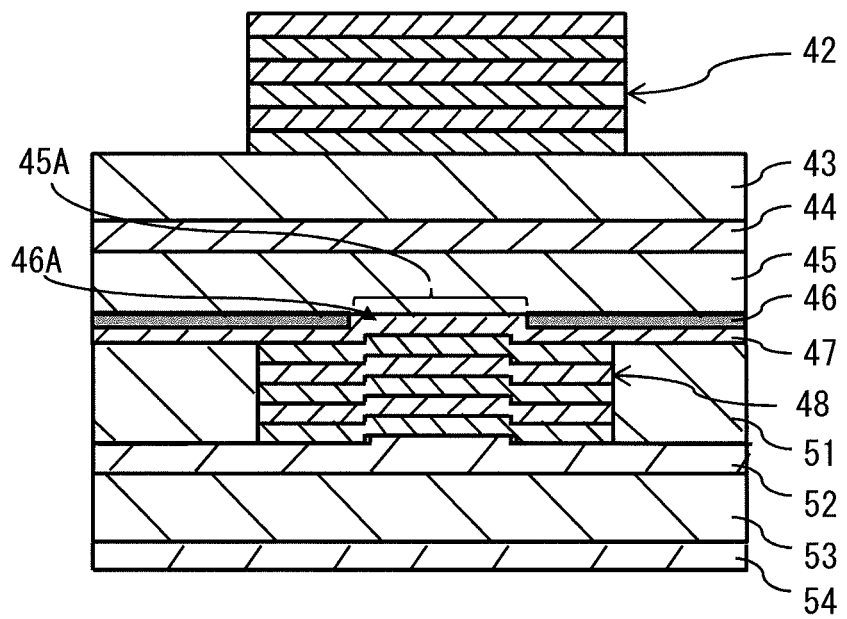
[ FIG. 10E ]
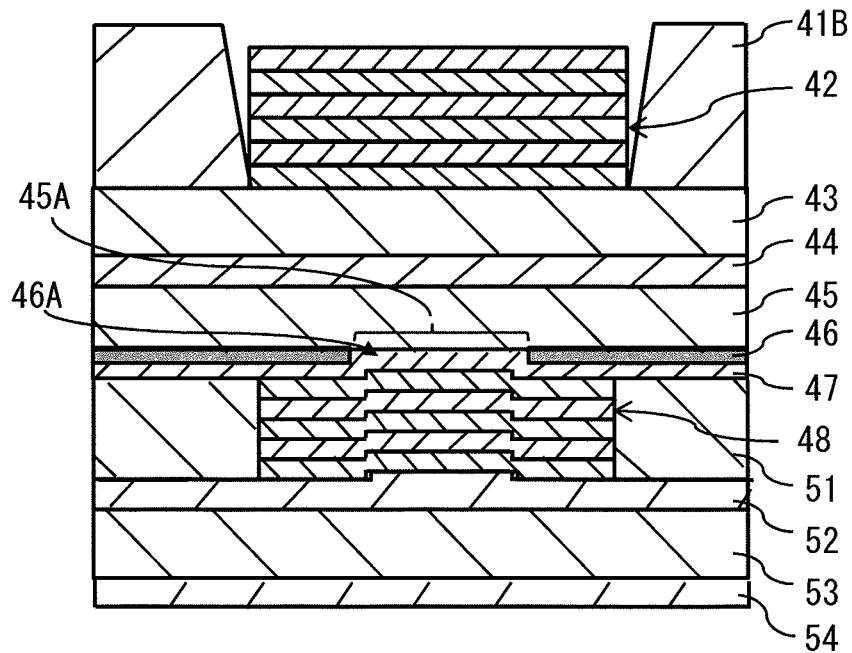

[ FIG. 10F ]
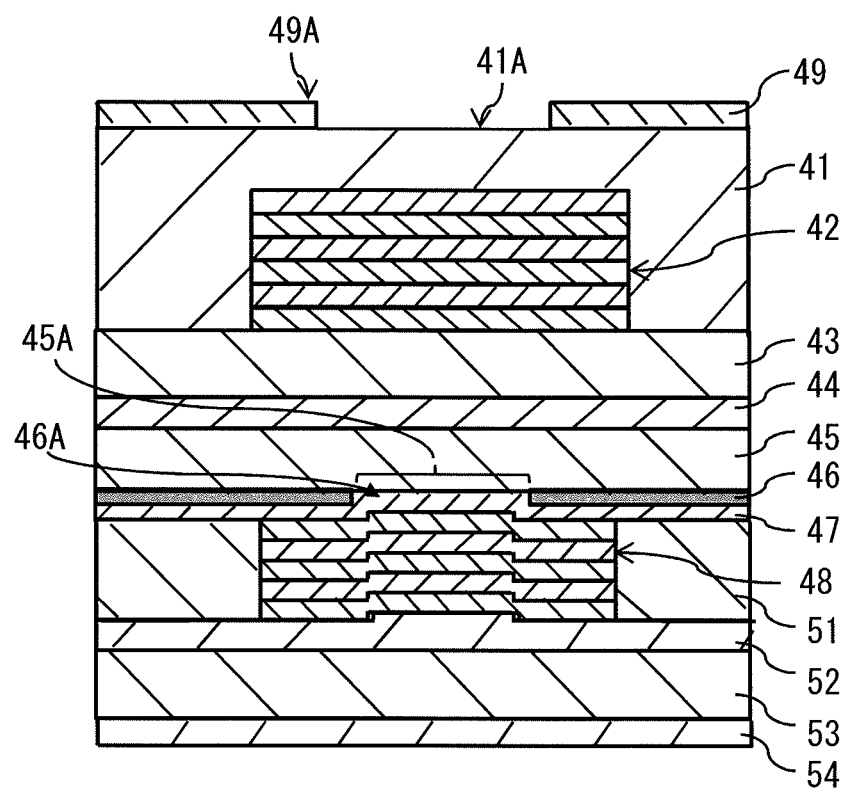

[ FIG. 11 ]
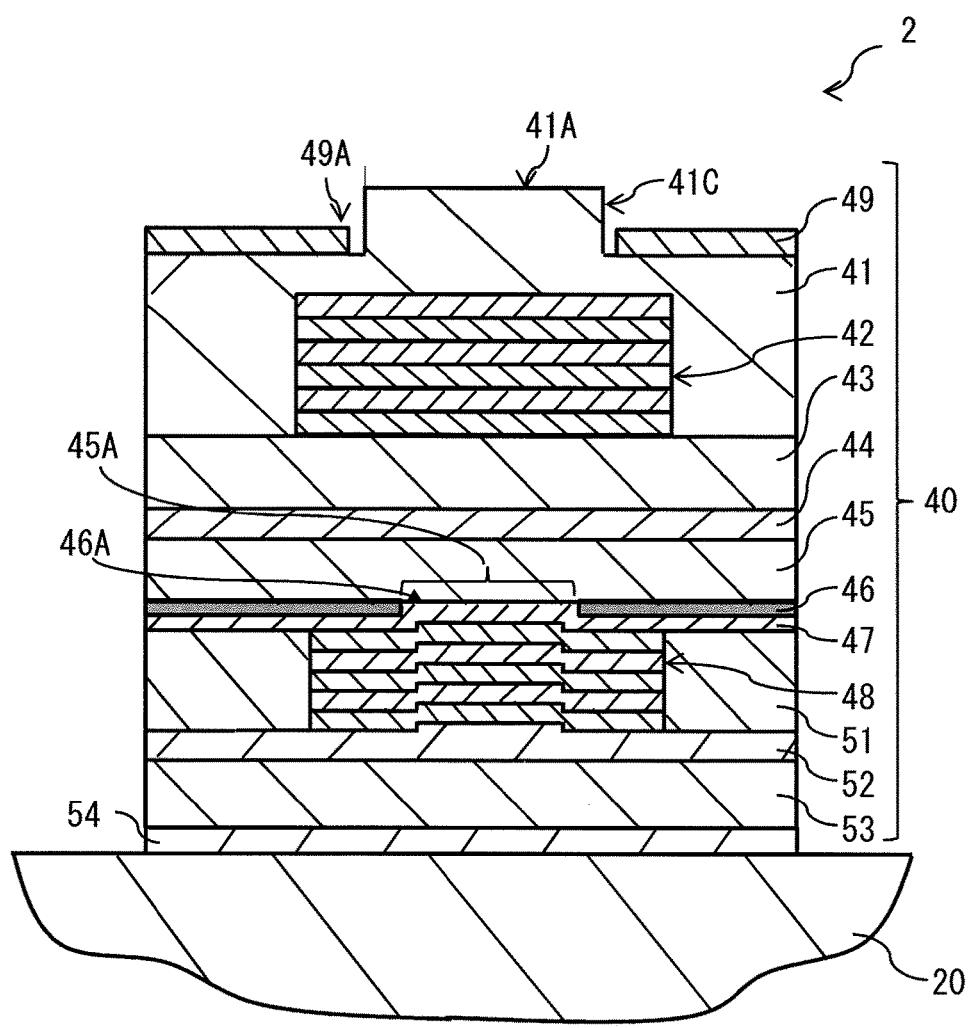

[ FIG. 12 ]
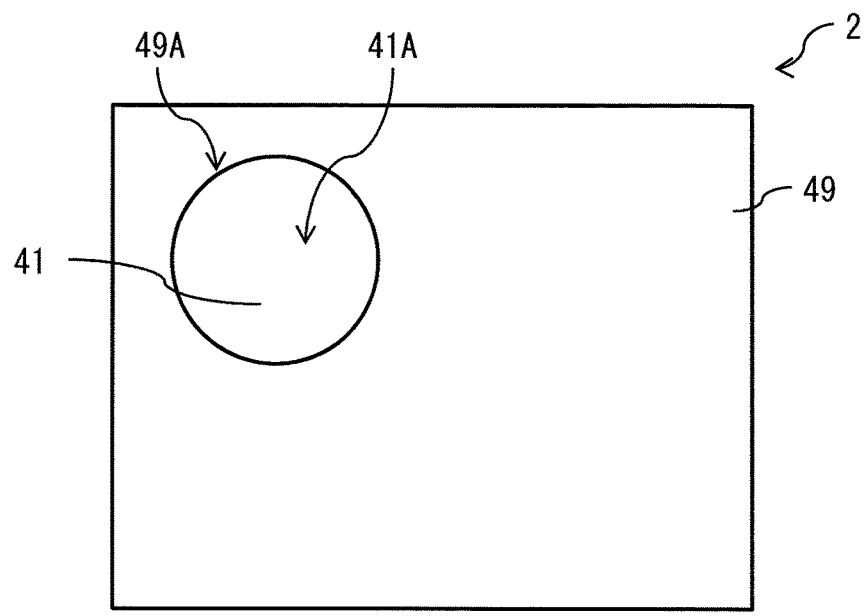
[ FIG. 13 ]
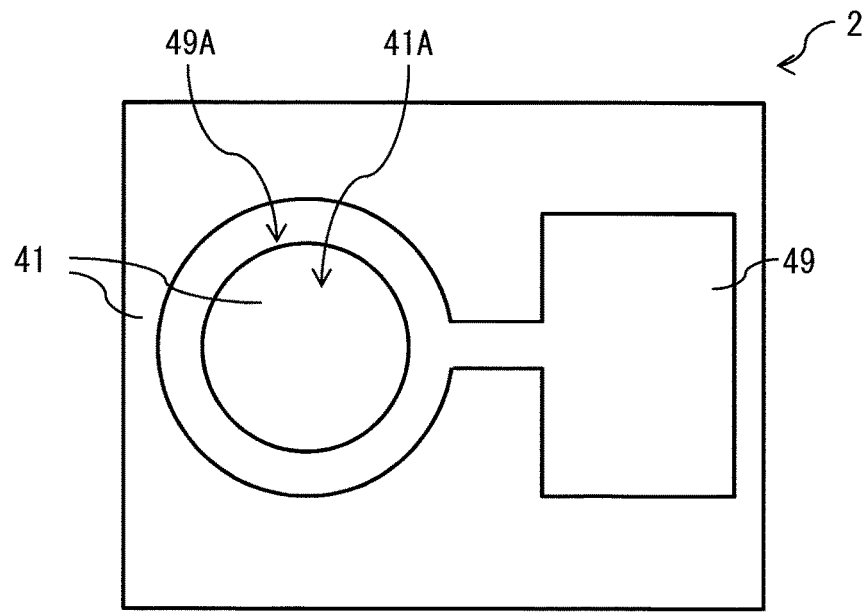

[ FIG. 14 ]
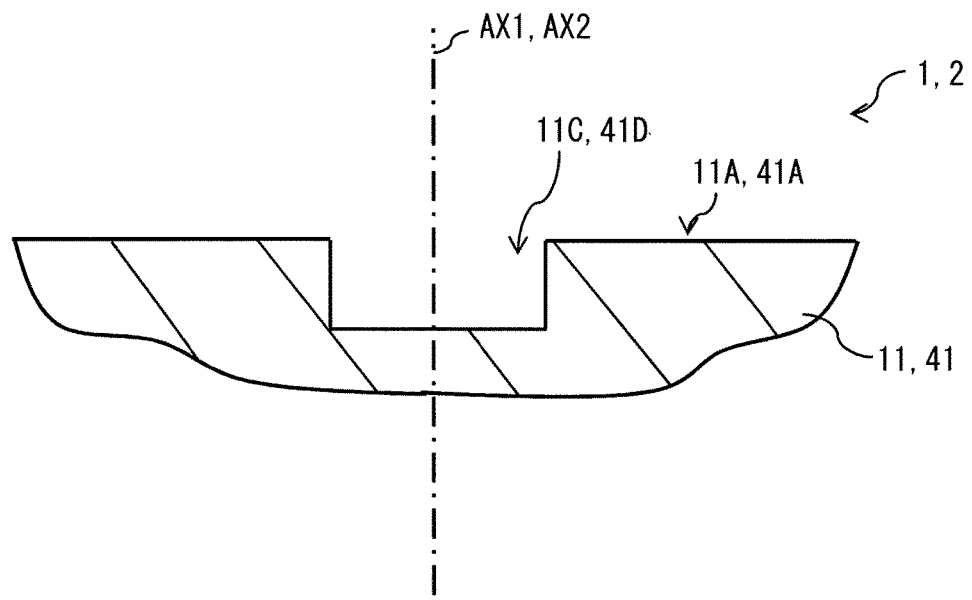
[ FIG. 15 ]
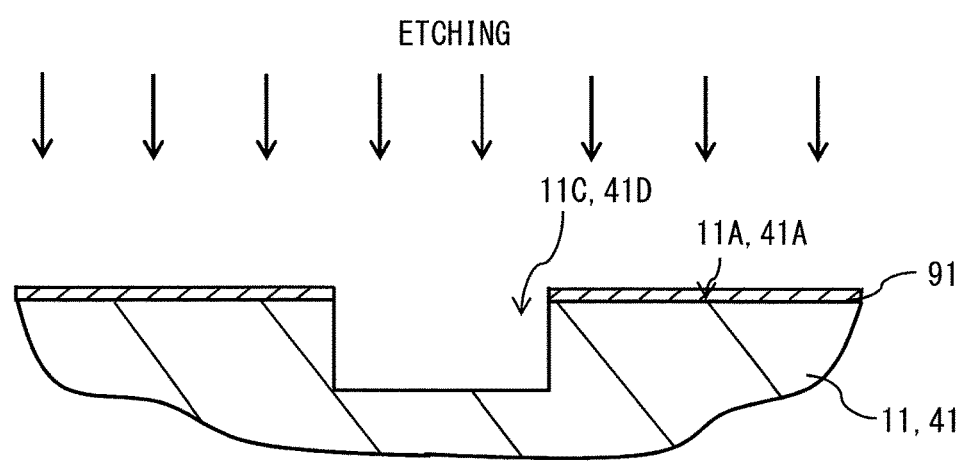

[ FIG. 16 ]
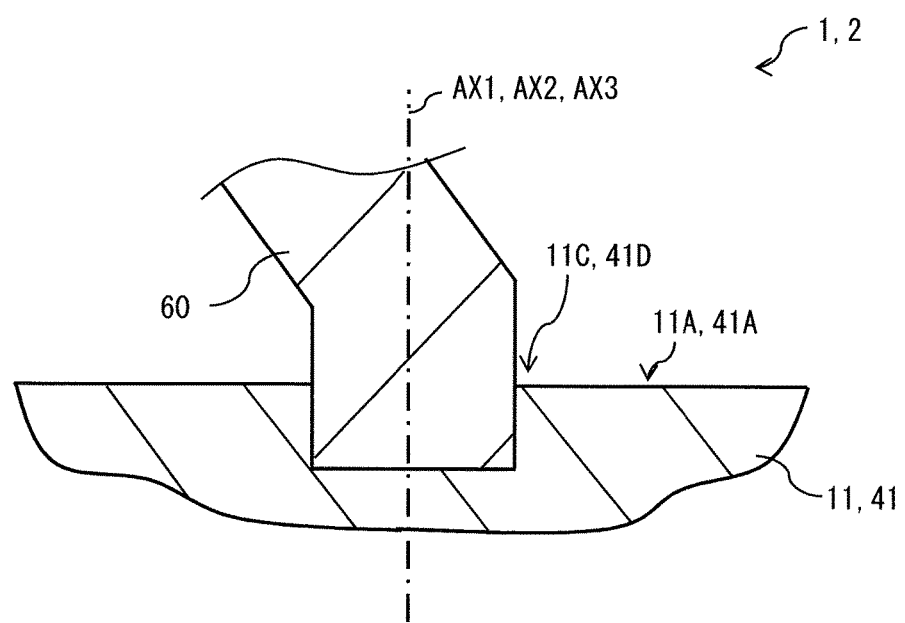
[ FIG. 17 ]
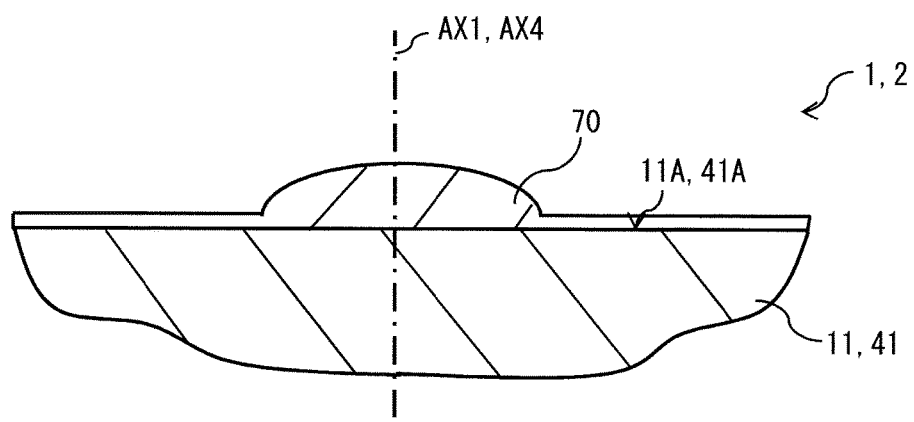

[ FIG. 18 ]
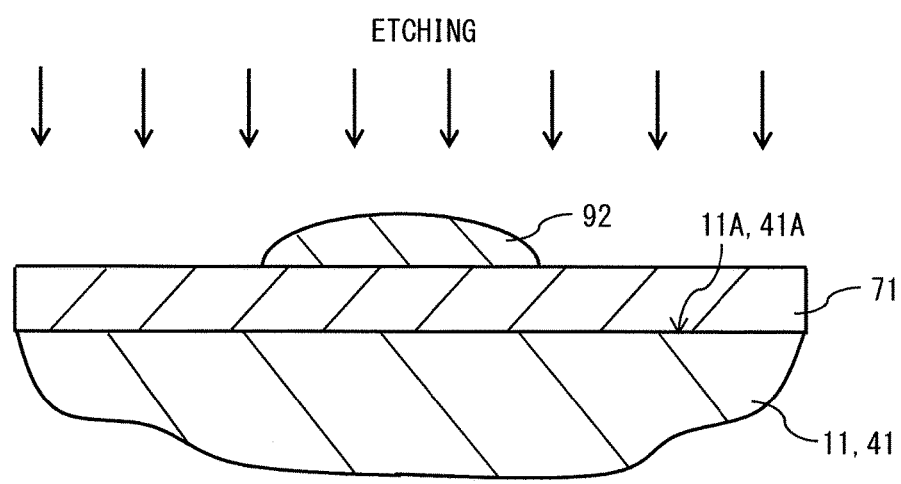
[ FIG. 19 ]
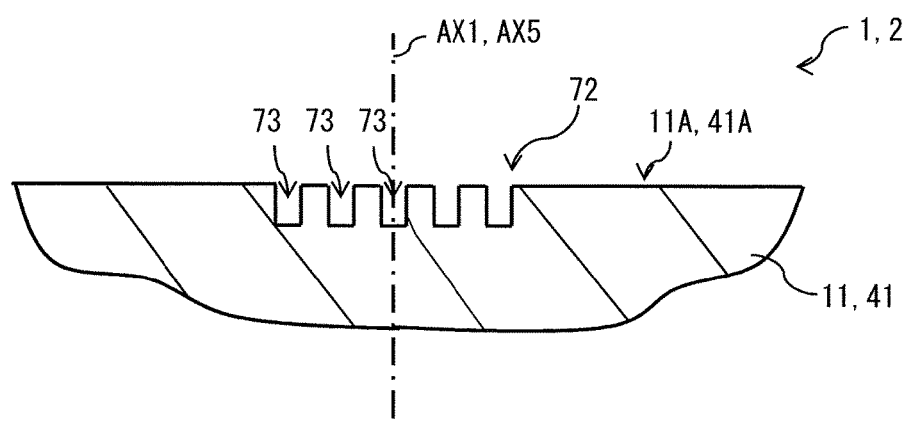

[ FIG. 20 ]
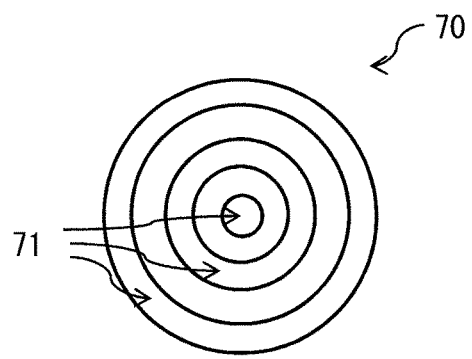
[ FIG. 21 ]
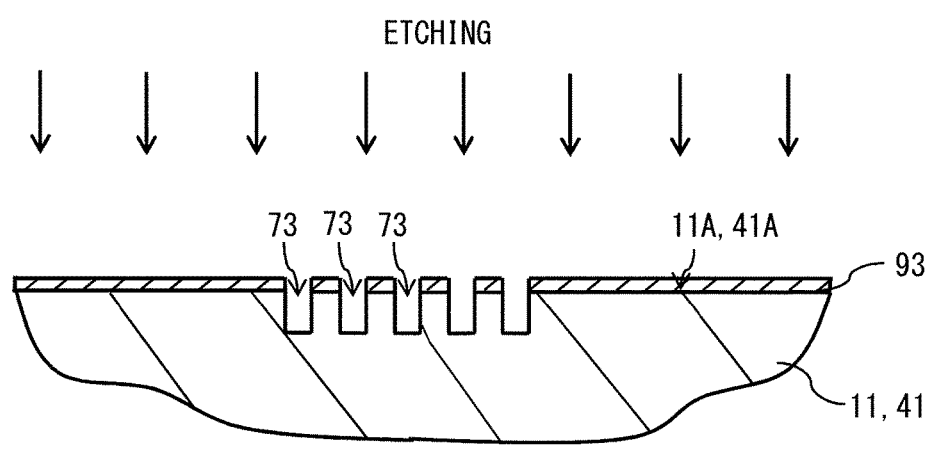

[ FIG. 22 ]
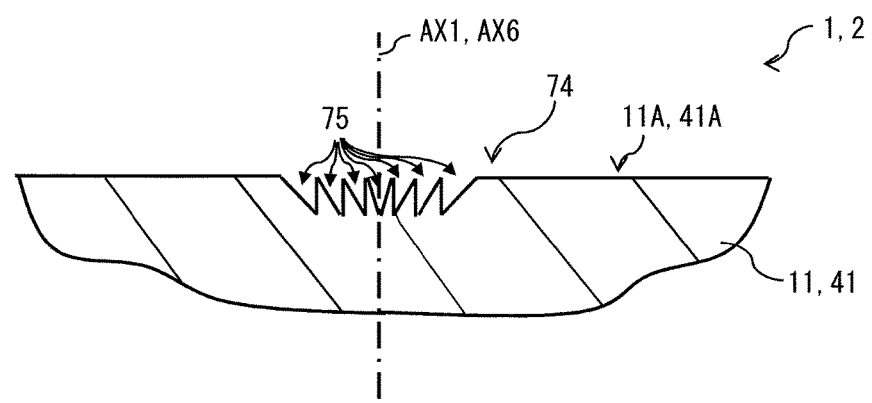
[ FIG. 23 ]
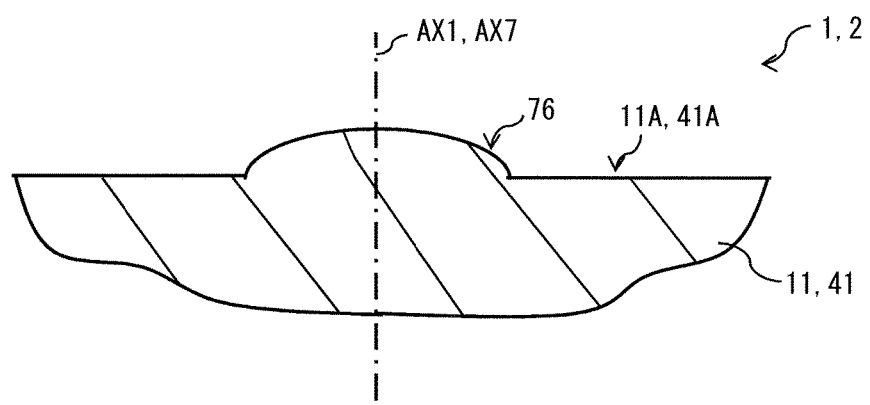

[ FIG. 24 ]
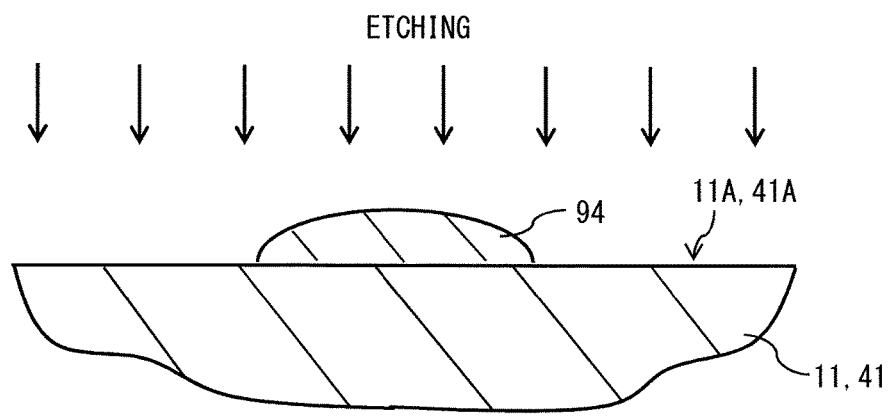
[ FIG. 25 ]
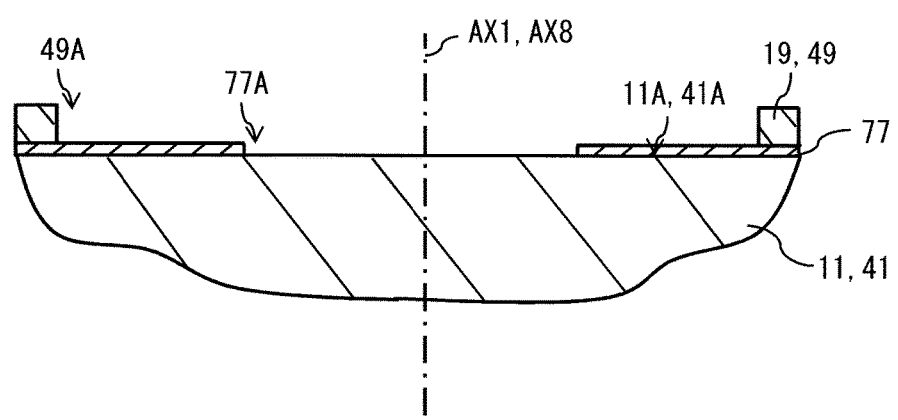

[ FIG. 26 ]
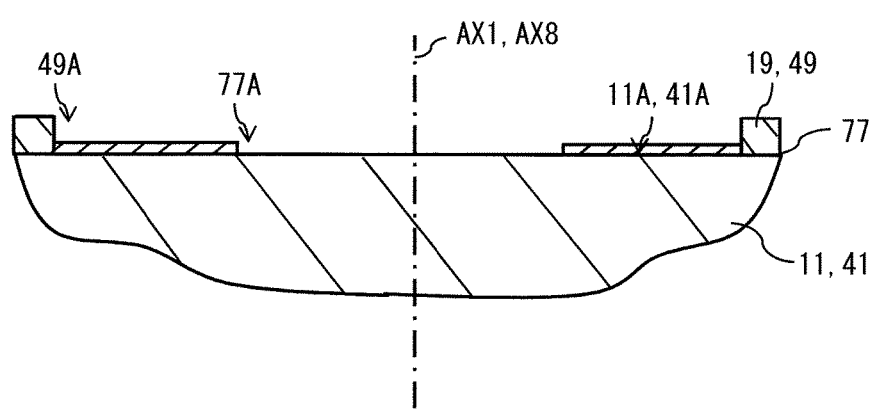
[ FIG. 27 ]
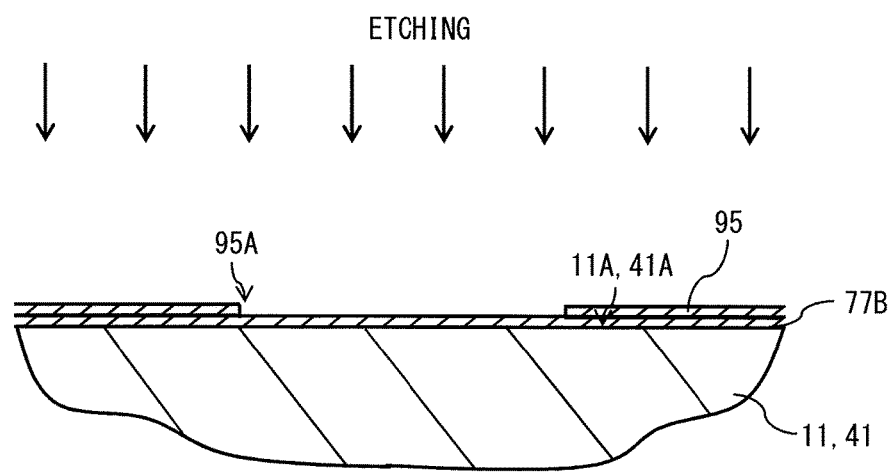

SURFACE LIGHT-EMITTING LASER

CROSS-REFERENCE TO RELATED APPLICATIONS

The present application claims the benefit of International Application No. PCT/JP2016/074074, filed Aug. 18, 2016, which claims priority to Japanese Application No. 2015-181627, filed Sep. 15, 2015, the disclosures of which are incorporated herein by reference.

BACKGROUND

The technology relates to a nitride-based surface-emitting laser that outputs light in a stacking direction.

In recent years, development of a nitride-based surface-emitting laser has been carried out (for example, see PTLs 1 and 2).

CITATION LIST

Patent Literature

PTL 1: Japanese Unexamined Patent Application Publication No. 2015-35541
PTL 2: Japanese Unexamined Patent Application Publication No. 2015-35542

SUMMARY

Meanwhile, to collimate light from a laser, or couple light from each of arrayed lasers, it is necessary to provide optical elements including, for example, a lens and connection terminals of an optical fiber on an output surface of the laser. In providing the above-described optical elements on a light output surface of a nitride-based surface-emitting laser, accurate alignment of an optical axis of the above-described optical elements with an optical axis of the surface-emitting laser allows expected effects to be achieved. However, the accurate alignment of both of the optical axes has great difficulty. This is because, in the nitride-based surface-emitting laser, a bare multi-layer film reflecting mirror is typically formed on a surface exposed by removing a substrate in a manufacturing process, and therefore there is no region available for formation of the above-described optical elements. Further, it is also very difficult to provide the light output surface of the nitride-based surface-emitting laser with a function of an external resonator mirror. This is because, for the above-described reason, it is difficult to provide the light output surface at a proper position as the external resonator mirror. As described above, the nitride-based surface-emitting laser has had a concern in that it is not easy to accurately determine positions of the above-described optical elements within the light output surface, or a position of the light output surface in a thickness direction.

It is therefore desirable to provide a nitride-based surface-emitting laser that makes it possible to accurately determine the positions of the above-described optical elements within the light output surface, the position of the light output surface in the thickness direction, or both.

A surface-emitting laser according to an embodiment of the technology includes a laser element section that includes a first multi-layer film reflecting mirror, a first semiconductor layer of a first conductivity type, an active layer, a second semiconductor layer of a second conductivity type, a second multi-layer film reflecting mirror, a nitride semiconductor layer of the second conductivity type, and a light output surface in this order. The laser element section further includes an electrode that injects a current into the active layer.

In the half-surface-emitting laser according to the embodiment of the technology, the nitride semiconductor layer is provided between the second multi-layer film reflecting mirror and the light output surface. This allows a top surface of the nitride semiconductor layer, or a top surface of some sort of layer provided on the nitride semiconductor layer to serve as the light output surface of the laser element section, which makes it possible to accurately determine the position of the light output surface in the thickness direction by adjusting a thickness of the nitride semiconductor layer, for example. Further, it is possible to provide the optical elements such as the lens and connection terminals of the optical fiber on the top surface of the nitride semiconductor layer, which allows the positions of the above-described optical elements within the light output surface to be determined accurately.

According to the surface-emitting laser of the embodiment of the technology, the nitride semiconductor layer is provided between the second multi-layer film reflecting mirror and the light output surface. This makes it possible to accurately determine the positions of the above-described optical elements within the light output surface, the position of the light output surface in the thickness direction, or both. It is to be noted that the effects of the technology are not necessarily limited to the effects described above, and may be any of the effects that will be described herein.

BRIEF DESCRIPTION OF DRAWINGS

FIG. 1 is a cross-sectional view of an example of a nitride-based surface-emitting laser according to a first embodiment of the technology.

FIG. 2 is a top view of the surface-emitting laser illustrated in FIG. 1.

FIG. 3 is a diagram illustrating an example of intensity distribution of output light of the surface-emitting laser illustrated in FIG. 1.

FIG. 4A is a cross-sectional view of an example of a manufacturing process of the surface-emitting laser illustrated in FIG. 1.

FIG. 4B is a cross-sectional view of an example of the manufacturing process following on the process illustrated in FIG. 4A.

FIG. 4C is a cross-sectional view of an example of the manufacturing process following on the process illustrated in FIG. 4B.

FIG. 4D is a cross-sectional view of an example of the manufacturing process following on the process illustrated in FIG. 4C.

FIG. 4E is a cross-sectional view of an example of the manufacturing process following on the process illustrated in FIG. 4D.

FIG. 5 is a cross-sectional view of a modification example of the surface-emitting laser illustrated in FIG. 1.

FIG. 6 is a cross-sectional view of a modification example of the surface-emitting laser illustrated in FIG. 1.

FIG. 7 is a cross-sectional view of a modification example of the surface-emitting laser illustrated in FIG. 5.

FIG. 8 is a cross-sectional view of an example of a nitride-based surface-emitting laser according to a second embodiment of the technology.

FIG. 9 is a top view of the surface-emitting laser illustrated in FIG. 8.

FIG. 10A is a cross-sectional view of an example of a manufacturing process of the surface-emitting laser illustrated in FIG. 8.

FIG. 10B is a cross-sectional view of an example of the manufacturing process following on the process illustrated in FIG. 10A.

FIG. 10C is a cross-sectional view of an example of the manufacturing process following on the process illustrated in FIG. 10B.

FIG. 10D is a cross-sectional view of an example of the manufacturing process following on the process illustrated in FIG. 10C.

FIG. 10E is a cross-sectional view of an example of the manufacturing process following on the process illustrated in FIG. 10D.

FIG. 10F is a cross-sectional view of an example of the manufacturing process following on the process illustrated in FIG. 10E.

FIG. 11 is a cross-sectional view of a modification example of the surface-emitting laser illustrated in FIG. 8.

FIG. 12 is a top view of a modification example of each of the surface-emitting lasers illustrated in FIG. 8 and FIG. 11.

FIG. 13 is a top view of a modification example of each of the surface-emitting lasers illustrated in FIG. 8 and FIG. 11.

FIG. 14 is a cross-sectional view of a modification example of each of the surface-emitting lasers illustrated in FIG. 1, FIGS. 5 to 8, and FIGS. 11 to 13.

FIG. 15 is a cross-sectional view of an example of a manufacturing process of the surface-emitting laser illustrated in FIG. 14.

FIG. 16 is a cross-sectional view of an example of a surface-emitting laser in which an optical fiber is coupled to a laser element section illustrated in FIG. 14.

FIG. 17 is a cross-sectional view of a modification example of each of the surface-emitting lasers illustrated in FIG. 1, FIGS. 5 to 8, and FIGS. 11 to 13.

FIG. 18 is a cross-sectional view of an example of a manufacturing process of the surface-emitting laser illustrated in FIG. 17.

FIG. 19 is a cross-sectional view of a modification example of each of the surface-emitting lasers illustrated in FIG. 1, FIGS. 5 to 8, and FIGS. 11 to 13.

FIG. 20 is a top view of a lens in the surface-emitting laser illustrated in FIG. 19.

FIG. 21 is a cross-sectional view of an example of a manufacturing process of the surface-emitting laser illustrated in FIG. 19.

FIG. 22 is a cross-sectional view of a modification example of the surface-emitting laser illustrated in FIG. 17.

FIG. 23 is a cross-sectional view of a modification example of each of the surface-emitting lasers illustrated in FIG. 1, FIGS. 5 to 8, and FIGS. 11 to 13.

FIG. 24 is a cross-sectional view of an example of a manufacturing process of the surface-emitting laser illustrated in FIG. 23.

FIG. 25 is a cross-sectional view of a modification example of each of the surface-emitting lasers illustrated in FIG. 1, FIGS. 5 to 8, and FIGS. 11 to 13.

FIG. 26 is a cross-sectional view of a modification example of the surface-emitting laser illustrated in FIG. 25.

FIG. 27 is a cross-sectional view of an example of a manufacturing process of each of the surface-emitting lasers illustrated in FIGS. 25 and 26.

DETAILED DESCRIPTION

Hereinafter, some embodiments of the invention are described in detail with reference to the drawings. It is to be noted that the description is given in the following order.

1. First Embodiment (FIGS. 1 to 4E)

An example where a light output surface is provided on a formation substrate of a multi-layer film reflecting mirror 2. Modification Examples of First Embodiment (FIGS. 5 to 7)

An example where the multi-layer film fleeting mirror on the side of a light output surface is formed through epitaxial growth An example where the light output surface is provided on a top surface of a mesa portion 3. Second Embodiment (FIGS. 8 to 10F)

An example where the light output surface is provided on a semiconductor layer that is formed by embedding the multi-layer film reflecting mirror therein 4. Modification Examples of Second Embodiment (FIGS. 11 to 13)

An example where the light output surface is provided on a top surface of the mesa portion An example where a current injection region is shifted from a central portion of the multi-layer film reflecting mirror 5. Modification Examples Common to Respective Embodiments (FIGS. 14 to 27)

An example where a concave portion is provided on the light output surface

An example where an optical fiber is coupled to the concave portion of the light output surface An example where a lens is provided on the light output surface An example where an inhibitory layer that attenuates a high-order lateral mode is provided on the light output surface 1. First Embodiment

[Configuration]

FIG. 1 illustrates an example of a cross-sectional configuration of a surface-emitting laser 1 according to a first embodiment of the technology. FIG. 2 illustrates an example of a top-side configuration of the surface-emitting laser 1. FIG. 3 illustrates an example of intensity distribution of light to be outputted from a light output surface 11A on a top surface of the surface-emitting laser 1. It is to be noted that FIGS. 1 to 3 are represented schematically, and dimensions and shapes illustrated therein are different from actual dimensions and shapes. In explanation of a configuration of the surface-emitting laser 1, an "upper side" refers to side of the light output surface 11A, and a "lower side" refers to side of a sub-mount section 30 to be described later.

For example, as illustrated in FIG. 1, the surface-emitting laser 1 includes a laser element section 10 and the sub-mount section 30. In the surface-emitting laser 1, the laser element section 10 is fixed to the sub-mount section 30. The surface-emitting laser 1 corresponds to a specific example of a "surface-emitting laser" of the technology. The laser element section 10 corresponds to a specific example of a "laser element section" of the technology. It is to be noted that the sub-mount section 30 may be omitted on an as-needed basis.

The sub-mount section 30 serves to dissipate heat generated in the laser element section 10, and includes a ceramic material, for example. Examples of the ceramic material to be used for the sub-mount section 30 include an aluminum nitride (AlN), an alumina ($Al_2O_3$), etc.

The laser element section 10 includes, for example, a semiconductor layer 11, a multi-layer film reflecting mirror 12, a semiconductor layer 13, an active layer 14, a semiconductor layer 15, a current constriction layer 16, an electrode layer 17, and a multi-layer film reflecting mirror 18 in this order from the side of the light output surface 11A. Further, the laser element section 10 includes, for example, an electrode layer 19 on a surface of the semiconductor layer 11 on the side of the light output surface 11A. In addition, the laser element section 10 includes, for example, an electrode layer 21 around the multi-layer film reflecting mirror 18. Furthermore, the laser element section 10 includes, for example, a junction layer 22, a support substrate 23, and an electrode layer 24 in this order from the side of the multi-layer film reflecting mirror 18. The multi-layer film reflecting mirror 12 and the multi-layer film reflecting mirror 18 function as resonators.

It is to be noted that the electrode layer 21, the junction layer 22, the support substrate 23, and the electrode layer 24 may be omitted on an as-needed basis. In a case where the electrode layer 21, the junction layer 22, the support substrate 23, and the electrode layer 24 are omitted, for example, a solder is provided between the laser element section 10 and the sub-mount section 30. The solder serves to fix the laser element section 10 to the sub-mount section 30, and to transmit heat generated in the laser element section 10 to the sub-mount section 30.

The semiconductor layer 11 corresponds to a specific example of a "nitride semiconductor layer of a second conductivity type" of the technology. The multi-layer film reflecting mirror 12 corresponds to a specific example of a "second multi-layer film reflecting mirror" of the technology. The semiconductor layer 13 corresponds to a specific example of a "second semiconductor layer of the second conductivity type" of the technology. The active layer 14 corresponds to a specific example of an "active layer" of the technology. The semiconductor layer 15 corresponds to a specific example of a "first semiconductor layer of a first conductivity type" of the technology. The light output surface 11A corresponds to a specific example of a "light output surface" of the technology. The current constriction layer 16 corresponds to a specific example of a "current constriction layer" of the technology. The electrode layer 17 corresponds to a specific example of a "first electrode" of the technology. The multi-layer film reflecting mirror 18 corresponds to a specific example of a "first multi-layer film reflecting mirror" of the technology. The electrode layer 19 corresponds to a specific example of a "second electrode" of the technology.

The semiconductor layer 11 is a substrate used to form the multi-layer film reflecting mirror 12. A top surface (the light output surface 11A) of the semiconductor layer 11 functions as an external resonator mirror with respect to the multi-layer film reflecting mirror 12 and the multi-layer film reflecting mirror 18. The light output surface 11A is provided at a position for functioning as the external resonator mirror with respect to the multi-layer film reflecting mirror 12 and the multi-layer film reflecting mirror 18. The surface-emitting laser 1 is configured to output a multiwavelength-oscillated laser beam as illustrated in FIG. 3 with the help of a function of the external resonator mirror. The semiconductor layer 11 is a substrate obtained, for example, by adjusting a thickness of a substrate 11D (to be described later) for formation of the multi-layer film reflecting mirror 12 to a predetermined thickness with use of a CMP (Chemical Mechanical Polishing) technique, etc. A thickness of the semiconductor layer 11 is at least 10 µm but no more than 400 µm, for example.

The semiconductor layer 11 is a nitride semiconductor substrate of a first conductivity type. The first conductivity type is an n-type, for example. The nitride semiconductor substrate configuring the semiconductor layer 11 is a substrate that transmits visible light, and examples of such a substrate include a GaN substrate, an AlGaN substrate, an InGaN substrate, or an AlInGaN substrate, etc. The nitride semiconductor substrate configuring the semiconductor layer 11 may include, for example, B, Tl, As, P, Sb, etc.

Each of the semiconductor layer 13, the active layer 14, and the semiconductor layer 15 includes a nitride semiconductor. The nitride semiconductor is, for example, GaN, AlGaN, InGaN, AlInGaN, etc. A conductivity type of the semiconductor layer 13 is the same as the conductivity type of the semiconductor layer 11, and is the n-type, for example. In contrast, the conductivity type of the semiconductor layer 15 is different from the conductivity type of the semiconductor layer 13. In a case where the conductivity type of the semiconductor layer 13 is the n-type, the conductivity type of the semiconductor layer 15 is a p-type. The semiconductor layer 13 includes a nitride semiconductor of the first conductivity type. The semiconductor layer 15 includes a nitride semiconductor of the second conductivity type. It is to be noted that each of the semiconductor layer 13 and the semiconductor layer 15 may be a layer of a single-layer structure, a layer of a multi-layer structure, or a layer of a superlattice structure. Further, each of the semiconductor layer 13 and the semiconductor layer 15 may be a layer including a composition gradient layer or a concentration gradient layer.

The semiconductor layer 13 is in contact with side surfaces and an undersurface of the multi-layer film reflecting mirror 12, and is further in contact with a region corresponding to the surrounding region of the multi-layer film reflecting mirror 12 on the undersurface of the semiconductor layer 11. The semiconductor layer 13 is formed with use of a method employing epitaxial growth in a lateral direction, such as an ELO (Epitaxial Lateral Overgrowth) method using the multi-layer film reflecting mirror 12 as a mask. In other words, the semiconductor layer 13 is a semiconductor layer that is formed by embedding the multi-layer film reflecting mirror 12 therein.

The active layer 14 includes, for example, a bandgap corresponding to a waveband of light at an ultraviolet region (ultraviolet light), and is configured to emit the ultraviolet light through current injection. The active layer 14 has, for example, a quantum well structure. The quantum well structure uses a pair of a well layer and a barrier layer, and is configured by laminating a plurality of pairs of the well layer and the barrier layer. Examples of combinations of the well layer and the barrier layer include ($In_yGa_{(1-y)}N$, GaN), ($In_yGa_{(1-y)}N$, $In_zGa_{(1-z)}N$), ($In_yGa_{(1-y)}N$, AlGaN), (GaN, $Al_yGa_{(1-y)}N$), ($Al_zGa_{(1-z)}N$, $Al_yGa_{(1-y)}N$), etc., where y is greater than z.

The multi-layer film reflecting mirror 12 is in contact with a portion of the undersurface of the semiconductor layer 11, and is embedded in the semiconductor layer 13. For example, when viewed from a direction of an optical axis AX1 of the surface-emitting laser 1, the multi-layer film reflecting mirror 12 takes a rectangular, polygonal, circular, or elliptical shape. It is to be noted that the optical axis AX1 of the surface-emitting laser 1 is along a thickness direction of the surface-emitting laser 1, and passes through a center of a current injection region 15A. The multi-layer film reflecting mirror 12 is a dielectric multi-layer film reflecting mirror that functions as a DBR (Distributed Bragg Reflector). Here, the above-described dielectric multi-layer film reflecting mirror is configured in such a manner that two or more kinds of dielectric films made of dielectric materials having different refractive indexes from each other are laminated alternately. Examples of the dielectric materials that are usable for the above-described dielectric multi-layer film reflecting mirror include oxides (oxides of Si, Mg, Al, Hf, Nb, Zr, Sc, Ta, Ga, Zn Y, R, Ti, etc.), nitrides (AlN, AlGaN, GaN, and BN), fluorides, etc. Examples of the dielectric materials that are usable for the above-described dielectric multi-layer film reflecting mirror include $SiO_2$, $TiO_2$, $Nb_2O_5$, $ZrO_2$, $Ta_2O_5$, ZnO, $Al_2O_3$, $HfO_2$, AlN, SiN, MgO, etc. Examples of combinations of two kinds of the dielectric films that are usable for the above-described dielectric multi-layer film reflecting mirror include combinations of an $SiO_2$ layer/an SiN layer, the $SiO_2$ layer/an $Nb_2O_5$ layer, the $SiO_2$ layer/a $ZrO_2$ layer, the $SiO_2$ layer/an AlN layer, etc.

A constituent material, a film thickness, the number of laminated layers, etc. of each of the above-described dielectric films are set to achieve the desired optical reflectance in the multi-layer film reflecting mirror 12. A thickness of each of the above-described dielectric films is set on the basis of an oscillation wavelength λo in a fundamental lateral mode, and a refractive index n at the oscillation wavelength λo of a material to be used. The thickness of each of the above-described dielectric films is preferably an odd multiple of λo/(4n). For example, in a case where the oscillation wavelength λo is set at 410 nm, and the multi-layer film reflecting mirror 12 includes the $SiO_2/Nb_2O_5$, the thickness of each of the above-described dielectric films is, for example, within the range of about 40 nm to about 70 nm. The number of laminated layers of the multi-layer film reflecting mirror 12 is preferably at least about 5 but no more than about 20. The overall thickness of the multi-layer film reflecting mirror 12 is, for example, within the range of 0.6 μm to about 1.7 μm.

The current constriction layer 16 has an opening 16A directed to constricting a current to be injected into the active layer 14. The opening 16A corresponds to a specific example of a "first opening" of the technology. A portion facing the opening 16A on the top surface of the semiconductor layer 11 is the light output surface 11A. A portion facing the opening 16A on the undersurface of the semiconductor layer 15 is the current injection region 15A for a laminated body including the semiconductor layer 13, the active layer 14, and the semiconductor layer 15. The current constriction layer 16 includes an insulating material, and includes $SiO_2$, SiN, or $Al_2O_3$, for example. The opening 16A takes, for example, a circular shape. A diameter of the opening 16A (or the current injection region 15A) is, for example, at least 2 μm but no more than 100 μm. It is to be noted that, instead of the current constriction layer 16, a high-resistance region may be provided on the undersurface of the semiconductor layer 15. The high-resistance region has an opening corresponding to the opening 16A, and includes a function of constricting the current to be injected into the active layer 14.

The electrode layer 17 configures a pair of electrodes along with the electrode layer 19. The electrode layer 17 and the electrode layer 19 are electrodes directed to injecting the current into the active layer 14. The electrode layer 17 is provided in contact with the undersurface of the semiconductor layer 15. The electrode layer 17 is provided in contact with the current injection region 15A through the opening 16A. The electrode layer 17 includes a transparent conductive material having light transmission characteristics. Examples of the above-described transparent conductive material include an indium-tin oxide (ITO, Indium Tin Oxide, including an Sn-doped $In_2O_3$, a crystalline ITO, and an amorphous ITO), an indium-zinc oxide (IZO, Indium Zinc Oxide), an IFO (F-doped $In_2O_3$), a tin oxide ($SnO_2$), an ATO (Sb-doped $SnO_2$), an FTO (F-doped $SnO_2$), and a zinc oxide (ZnO, including an Al-doped ZnO or a B-doped ZnO). The electrode layer 17 may include a transparent conductive film using, for example, a gallium oxide, a titanium oxide, a niobium oxide, a nickel oxide, etc. as a base layer.

The electrode layer 19 is provided in contact with the top surface of the semiconductor layer 11. The electrode layer 19 has an opening 19A corresponding to the light output surface 11A of the semiconductor layer 11. The opening 19A takes, for example, a circular shape. A diameter of the opening 19A is greater than a diameter of the opening 16A, and is, for example, at least 2 μm but no more than 100 μm. The electrode layer 19 includes one or more kinds of metal materials (including alloy materials) that are selected from a group including, for example, Au, Ag, Pd, Pt, Ni, Ti, V, W, Cr, Al, Cu, Zn, Sn, and In. The electrode layer 19 may be configured in a single-layer structure or a multi-layer structure. In a case where the electrode layer 19 is of the multi-layer structure, the electrode layer 19 includes, for example, a Ti layer/an Au layer, the Ti layer/an Al layer, the Ti layer/the Al layer/the Au layer, the Ti layer/a Pt layer/the Au layer, an Ni layer/the Au layer, the Ni layer/the Au layer/the Pt layer, the Ni layer/the Pt layer, a Pd layer/the Pt layer, an Ag layer/the Pd layer, etc. It is to be noted that the layer denoted before the slash symbol "/" is a layer closer to the active layer 14.

The multi-layer film reflecting mirror 18 is in contact with a portion of the undersurface of the electrode layer 17, and is embedded in the electrode layer 21. For example, when viewed from the direction of the optical axis AX1 of the surface-emitting laser 1, the multi-layer film reflecting mirror 18 takes a rectangular, polygonal, circular, or elliptical shape. The multi-layer film reflecting mirror 18 is a dielectric multi-layer film reflecting mirror that functions as the DBR. Here, the dielectric multi-layer film reflecting mirror configuring the multi-layer film reflecting mirror 18 is configured in such a manner that two or more kinds of dielectric films including dielectric materials having different refractive indexes from each other are laminated alternately. Examples of the dielectric materials that are usable for the dielectric multi-layer film reflecting mirror configuring the multi-layer film reflecting mirror 18 include oxides (oxides of Si, Mg, Al, Hf, Nb, Zr, Sc, Ta, Ga, Zn Y, R, Ti, etc.), nitrides (AlN, AlGaN, GaN, and BN), fluorides, etc. Examples of the dielectric materials that are usable for the dielectric multi-layer film reflecting mirror configuring the multi-layer film reflecting mirror 18 include $SiO_2$, $TiO_2$, $Nb_2O_5$, $ZrO_2$, $Ta_2O_5$, ZnO, $Al_2O_3$, $HfO_2$, AlN, SiN, MgO, etc. Examples of combinations of two kinds of the dielectric films that are usable for the dielectric multi-layer film reflecting mirror configuring the multi-layer film reflecting mirror 18 include combinations of an $SiO_2$ layer/an SiN layer, the $SiO_2$ layer/an $Nb_2O_5$ layer, the $SiO_2$ layer/a $ZrO_2$ layer, the $SiO_2$ layer/an AlN layer, etc.

A constituent material, a film thickness, the number of laminated layers, etc. of each of the dielectric films included in the multi-layer film reflecting mirror 18 are set to achieve the desired optical reflectance in the multi-layer film reflecting mirror 18. A thickness of each of the dielectric films included in the multi-layer film reflecting mirror 18 is set on the basis of the oscillation wavelength λo in the fundamental lateral mode, and the refractive index n at the oscillation wavelength λo of a material to be used. The thickness of each of the dielectric films included in the multi-layer film reflecting mirror 18 is preferably an odd multiple of λo/(4n). For example, in a case where the oscillation wavelength λo is set at 410 nm, and the multi-layer film reflecting mirror 18 includes the $SiO_2/Nb_2O_5$, the thickness of each of the dielectric films included in the multi-layer film reflecting mirror 18 is, for example, within the range of about 40 nm to about 70 nm. The number of laminated layers of the multi-layer film reflecting mirror 18 is preferably at least about 5 but no more than about 20. The thickness of the multi-layer film reflecting mirror 18 is, for example, within the range of 0.6 μm to 1.7 μm.

The electrode layer 21 serves to fill a gap around the multi-layer film reflecting mirror 18, and to electrically couple the electrode layer 17 and the junction layer 22 with each other. The electrode layer 21 includes, for example, a combination of the Ti layer/the Pt layer/the Au layer. The junction layer 22 serves to fix the multi-layer film reflecting mirror 18 to the support substrate 23, and to electrically couple the electrode layer 21 and the support substrate 23 with each other. The junction layer 22 includes, for example, a combination of the Au layer/the Sn layer. The support substrate 23 serves to support the laser element section 10A in a manufacturing process of the laser element section 10, and to electrically couple the junction layer 22 and the electrode layer 24 with each other. The support substrate 23 is, for example, an Si substrate. The electrode layer 24 serves to electrically couple the laser element section 10 to the sub-mount 30. The electrode layer 24 includes, for example, a combination of the Au layer/the Sn layer.

[Manufacturing Method]

Next, with reference to FIGS. 4A to 4E, the description is provided of a method of manufacturing the surface-emitting laser 1. FIG. 4A is a cross-sectional view of an example of a manufacturing process of the surface-emitting laser 1. FIG. 4B is a cross-sectional view of an example of the manufacturing process following on the process illustrated in FIG. 4A. FIG. 4C is a cross-sectional view of an example of the manufacturing process following on the process illustrated in FIG. 4B. FIG. 4D is a cross-sectional view of an example of the manufacturing process following on the process illustrated in FIG. 4C. FIG. 4E is a cross-sectional view of an example of the manufacturing process following on the process illustrated in FIG. 4D.

First, the multi-layer film reflecting mirror 12 is formed on the substrate 11D (FIG. 4A). The substrate 11D is a substrate that will be formed as the semiconductor layer 11 by processing to be performed subsequently. Specifically, the multi-layer film reflecting mirror 12 is formed by carrying out selective etching after forming a dielectric multi-layer film reflecting mirror on the whole region of the top surface of the substrate 11D. At this time, an exposed surface of the substrate 11D is formed around the multi-layer film reflecting mirror 12. Next, the semiconductor layer 13 into which the multi-layer film reflecting mirror 12 is embedded is formed with use of a method employing the epitaxial growth in the lateral direction, such as the ELO method, etc. using the multi-layer film reflecting mirror 12 as a mask (FIG. 4B). Thereafter, the active layer 14 and the semiconductor layer 15 are formed on the semiconductor layer 13 in this order using, for example, the MOCVD (Metal Organic Chemical Vapor Deposition: metalorganic chemical vapor deposition) method, etc.

Next, the current constriction layer 16 having the opening 16A is formed on the semiconductor layer 15 (FIG. 4C). Thereafter, the electrode layer 17 is formed that comes in contact with a surface of the semiconductor layer 15 that is exposed from the opening 16A, and a surface around the opening 16A of the current constriction layer 16 using, for example, a liftoff process. Afterward, the multi-layer film reflecting mirror 18 is formed on a surface of the electrode layer 17, and in a region including a region immediately above the opening 16A. At this time, the multi-layer film reflecting mirror 18 is preferably formed in a region facing the multi-layer film reflecting mirror 12. In such a manner, a laser element section 10A illustrated in FIG. 4C is formed.

Further, the electrode layer 21, the junction layer 22, the support substrate 23, and the electrode layer 24 are formed as necessary. For example, a support module 20 in which the electrode layer 21 and the junction layer 22 are formed on one side of the support substrate 23, and the electrode layer 24 is formed on the other side of the support substrate 23 is fixed to the laser element section 10A with the side of the electrode layer 21 faced toward the side of the multi-layer film reflecting mirror 18.

Next, a rear surface of the semiconductor layer 11A is ground down to a predetermined thickness with use of the CMP, mechanical grinding, or photoelectrochemical etching, etc. (FIG. 4D). As a result, the semiconductor layer 11 having a thickness adjusted to the predetermined thickness is formed (FIG. 4E). Thereafter, the electrode layer 19 having the opening 19A is formed on the surface (polished surface) of the semiconductor layer 11. At this time, the opening 19A is formed inside a region facing the multi-layer film reflecting mirror 18. In such a manner, the laser element section 10 is formed. Finally, as necessary, the laser element section 10 is fixed to the sub-mount section 30 with the multi-layer film reflecting mirror 18 faced downward. Thus, the surface-emitting laser 1 is manufactured.

[Effects]

Next, the description is provided of the effects of the surface-emitting laser 1.

Meanwhile, to collimate light from a laser, or couple light from each of arrayed lasers, it is necessary to provide optical elements including, for example, a lens and connection terminals of the optical fiber on an output surface of the laser. In providing the above-described optical elements on a light output surface of a nitride-based surface-emitting laser, accurate alignment of the optical axis of the above-described optical elements with the optical axis of the surface-emitting laser allows expected effects to be achieved. However, the accurate alignment of both of the optical axes has great difficulty. This is because, in the nitride-based surface-emitting laser, a bare multi-layer film reflecting mirror is typically formed on a surface exposed by removing a substrate in a manufacturing process, and therefore there is no region available for formation of the above-described optical elements. Further, it is also very difficult to provide the light output surface of the nitride-based surface-emitting laser with a function of an external resonator mirror. This is because, for the above-described reason, it is difficult to provide the light output surface at a proper position as the external resonator mirror. As described above, the nitride-based surface-emitting laser has had a concern that it is not easy to accurately determine positions of the above-described optical elements within the light output surface, or a position of the light output surface in a thickness direction.

In contrast, in the surface-emitting laser 1, the semiconductor layer 11 is provided between the multi-layer film reflecting mirror 12 and the light output surface 11A. This allows the top surface of the semiconductor layer 11 to serve as the light output surface 11A of the laser element section 10, which makes it possible to accurately determine a position of the light output surface 11A in the thickness direction by adjusting a thickness of the semiconductor layer 11, for example. Further, it is possible to provide the optical elements including, for example, the lens and connection terminals of the optical fiber on the top surface of the semiconductor layer 11, which allows the positions of the above-described optical elements within the light output surface 11A to be determined accurately. Accordingly, it is possible to accurately determine the positions of the above-described optical elements within the light output surface 11A, or the position of the light output surface 11A in the thickness direction.

2. Modification Examples of First Embodiment

Next, the description is provided of modification examples of the first embodiment. It is to be noted that any component parts common to those in the above-described embodiment are hereinafter denoted with the same reference numerals. Further, descriptions of the component parts common to those in the above-described embodiment are omitted as appropriate.

Modification Example A

In the above-described embodiment, the multi-layer film reflecting mirror 12 is a dielectric multi-layer film reflecting mirror; however, the multi-layer film reflecting mirror 12 may be a semiconductor multi-layer film reflecting mirror that is formed through the epitaxial growth, as illustrated in FIG. 5, for example. FIG. 5 illustrates a modification example of a cross-sectional configuration of the surface-emitting laser 1 according to the above-described embodiment.

In the present modification example, the multi-layer film reflecting mirror 12 is a nitride-based semiconductor multi-layer film reflecting mirror that functions as the DBR. A conductivity type of the semiconductor multi-layer film reflecting mirror configuring the multi-layer film reflecting mirror 12 is equivalent to a conductivity type of the semiconductor layer 11. The multi-layer film reflecting mirror 12 is configured in such a manner that two or more kinds of nitride semiconductor layers made of nitride semiconductor materials having different refractive indexes from one another are laminated alternately. A constituent material, a film thickness, the number of laminated layers, etc. of each of the nitride semiconductor layers included in the multi-layer film reflecting mirror 12 are set to achieve the desired optical reflectance in the multi-layer film reflecting mirror 12. A thickness of each of the nitride semiconductor layers included in the multi-layer film reflecting mirror 12 is set on the basis of at the oscillation wavelength λo and the refractive index n at the oscillation wavelength λo of a material to be used. The thickness of each of the nitride semiconductor layers included in the multi-layer film reflecting mirror 12 is preferably an odd multiple of λo/(4n). However, in the present modification example, the semiconductor layer 13 is formed in the typical MOCVD process without using the ELO process.

In the present modification example, the semiconductor layer 11 is provided between the multi-layer film reflecting mirror 12 and the light output surface 11A, as with the case of the above-described embodiment. Therefore, it is possible to accurately determine the positions of the above-described optical elements within the light output surface 11A, or the position of the light output surface 11A in the thickness direction.

Modification Example B

In the above-described embodiment and modification example A, the top surface of the semiconductor layer 11 is a flat surface; however, a convex mesa portion 11B may be provided on the top surface of the semiconductor layer 11, as illustrated in FIGS. 6 and 7, for example. FIG. 6 illustrates a modification example of a cross-sectional configuration of the surface-emitting laser 1 according to the above-described embodiment. FIG. 7 illustrates a modification example of a cross-sectional configuration of the surface-emitting laser 1 according to the modification example A.

A top surface of the mesa portion 11B serves as the light output surface 11A, and the electrode layer 19 is provided at a region corresponding to a base of the mesa portion 11B. In the present modification example, in a manufacturing process, after the top surfaces of the semiconductor layers 11 and 41 are formed, the mesa portion 11B is formed at a position corresponding to the light output surface 11A on each of the semiconductor layers 11 and 41. In other words, a position of the light output surface 11A in the thickness direction is specified prior to formation of the mesa portion 11B. Further, prior to the formation of the mesa portion 11B, it is possible to form the above-described optical elements on the light output surface 11A that is a portion of the top surface of each of the flat semiconductor layers 11 and 41. This makes it possible to accurately determine the positions of the above-described optical elements within the light output surface 11A, or the position of the light output surface 11A in the thickness direction, as with the case of the above-described embodiment.

3. Second Embodiment

[Configuration]

FIG. 8 illustrates an example of a cross-sectional configuration of a surface-emitting laser 2 according to a second embodiment of the technology. FIG. 9 illustrates an example of a top-side configuration of the surface-emitting laser 2. FIG. 3 illustrates an example of intensity distribution of light to be outputted from the light output surface 11A on the top surface of the surface-emitting laser 1. It is to be noted that FIGS. 8 and 9 are represented schematically, and dimensions and shapes illustrated therein are different from actual dimensions and shapes. In explanation of a configuration of the surface-emitting laser 2, an "upper side" refers to the side of a light output surface 41A, and a "lower side" refers to the side of a sub-mount section 30.

For example, as illustrated in FIG. 8, the surface-emitting laser 2 includes a laser element section 40 and the sub-mount section 30. In the surface-emitting laser 2, the laser element section 40 is fixed to the sub-mount section 30. The surface-emitting laser 2 corresponds to a specific example of the "surface-emitting laser" of the technology. The laser element section 40 corresponds to a specific example of the "laser element section" of the technology. It is to be noted that the sub-mount section 30 may be omitted on an as-needed basis.

The laser element section 40 includes, for example, a semiconductor layer 41, a multi-layer film reflecting mirror 42, a semiconductor layer 43, an active layer 44, a semiconductor layer 45, a current constriction layer 46, an electrode layer 47, and a multi-layer film reflecting mirror 48 in this order from the side of the light output surface 41A.

Further, the laser element section 40 includes, for example, an electrode layer 49 on a surface of the semiconductor layer 41 on the side of the light output surface 41A. In addition, the laser element section 40 includes, for example, an electrode layer 51 around the multi-layer film reflecting mirror 48. Furthermore, the laser element section 40 includes, for example, a junction layer 52, a support substrate 53, and an electrode layer 54 in this order from the side of the multi-layer film reflecting mirror 18. The multi-layer film reflecting mirror 42 and the multi-layer film reflecting mirror 48 function as resonators.

It is to be noted that the electrode layer 51, the junction layer 52, the support substrate 53, and the electrode layer 54 may be omitted on an as-needed basis. In a case where the electrode layer 51, the junction layer 52, the support substrate 53, and the electrode layer 54 are omitted, for example, a solder is provided between the laser element section 40 and the sub-mount section 30. The solder serves to fix the laser element section 40 to the sub-mount section 30, and to transmit heat generated in the laser element section 40 to the sub-mount section 30.

The semiconductor layer 41 corresponds to a specific example of the "nitride semiconductor layer of the second conductivity type" of the technology. The multi-layer film reflecting mirror 42 corresponds to a specific example of the "second multi-layer film reflecting mirror" of the technology. The semiconductor layer 43 corresponds to a specific example of the "second semiconductor layer of the second conductivity type" of the technology. The active layer 44 corresponds to a specific example of the "active layer" of the technology. The semiconductor layer 45 corresponds to a specific example of the "first semiconductor layer of the first conductivity type" of the technology. The light output surface 41A corresponds to a specific example of the "light output surface" of the technology. The current constriction layer 46 corresponds to a specific example of the "current constriction layer" of the technology. The electrode layer 47 corresponds to a specific example of the "first electrode" of the technology. The multi-layer film reflecting mirror 48 corresponds to a specific example of the "first multi-layer film reflecting mirror" of the technology. The electrode layer 49 corresponds to a specific example of the "second electrode" of the technology.

The semiconductor layer 41 is a semiconductor layer that is formed by embedding the multi-layer film reflecting mirror 42 therein. A top surface (the light output surface 41A) of the semiconductor layer 41 functions as an external resonator mirror with respect to the multi-layer film reflecting mirror 42 and the multi-layer film reflecting mirror 48. The light output surface 41A is provided at a position for functioning as the external resonator mirror with respect to the multi-layer film reflecting mirror 42 and the multi-layer film reflecting mirror 48. The surface-emitting laser 1 is configured to output a multiwavelength-oscillated laser beam as illustrated in FIG. 3 with the help of a function of the external resonator mirror. A thickness of the semiconductor layer 41 is, for example, at least 10 μm but no more than 400 μm.

The semiconductor layer 41 is a nitride semiconductor layer of a first conductivity type. The first conductivity type is the n-type, for example. The nitride semiconductor layer configuring the semiconductor layer 41 is a layer that transmits visible light, and examples of such a layer include a GaN layer, an AlGaN layer, an InGaN layer, an AlInGaN layer, etc. The nitride semiconductor layer configuring the semiconductor layer 41 may include, for example, B, Tl, As, P, Sb, etc.

Each of the semiconductor layer 43, the active layer 44, and the semiconductor layer 45 includes a nitride semiconductor. The nitride semiconductor is, for example, GaN, AlGaN, InGaN, AlInGaN, etc. A conductivity type of the semiconductor layer 43 is the same as the conductivity type of the semiconductor layer 41, and is the n-type, for example. In contrast, the conductivity type of the semiconductor layer 45 is different from the conductivity type of the semiconductor layer 43. In a case where the conductivity type of the semiconductor layer 43 is the n-type, the conductivity type of the semiconductor layer 45 is the p-type. The semiconductor layer 43 includes a nitride semiconductor of the first conductivity type. The semiconductor layer 45 includes a nitride semiconductor of a second conductivity type. It is to be noted that each of the semiconductor layer 43 and the semiconductor layer 45 may be a layer of a single-layer structure, a layer of a multi-layer structure, or a layer of a superlattice structure. Further, each of the semiconductor layer 43 and the semiconductor layer 45 may be a layer including a composition gradient layer or a concentration gradient layer.

The multi-layer film reflecting mirror 42 is in contact with a portion of the undersurface of the semiconductor layer 41, and is embedded in the semiconductor layer 43. For example, when viewed from a direction of an optical axis AX1 of the surface-emitting laser 2, the multi-layer film reflecting mirror 42 takes a rectangular, polygonal, circular, or elliptical shape. It is to be noted that the optical axis AX1 of the surface-emitting laser 2 is along a thickness direction of the surface-emitting laser 2, and passes through a center of a current injection region 45A. The multi-layer film reflecting mirror 42 is a dielectric multi-layer film reflecting mirror that functions as the DBR. Here, the dielectric multi-layer film reflecting mirror configuring the multi-layer film reflecting mirror 42 has a configuration similar to that of the dielectric multi-layer film reflecting mirror configuring the above-described multi-layer film reflecting mirror 12.

The current constriction layer 46 has an opening 46A serving to constrict a current to be injected into the active layer 44. The opening 46A corresponds to a specific example of the "first opening" of the technology. A portion facing the opening 46A on the top surface of the semiconductor layer 41 is the light output surface 41A. A portion facing the opening 46A on the undersurface of the semiconductor layer 45 is the current injection region 45A for a laminated body including the semiconductor layer 43, the active layer 44, and the semiconductor layer 45. The current constriction layer 46 has a configuration similar to that of the above-described current constriction layer 16. The opening 46A takes, for example, a circular shape. A diameter of the opening 46A (or the current injection region 45A) is, for example, at least 2 μm but no more than 100 μm. It is to be noted that, instead of the current constriction layer 46, a high-resistance region may be provided on the undersurface of the semiconductor layer 45. The high-resistance region has an opening corresponding to the opening 46A, and includes a function of constricting the current to be injected into the active layer 44.

The electrode layer 47 configures a pair of electrodes along with the electrode layer 49. The electrode layer 47 and the electrode layer 49 are electrodes serving to inject the current into the active layer 44. The electrode layer 47 is provided in contact with the undersurface of the semiconductor layer 45. The electrode layer 47 is provided in contact with the current injection region 45A through the opening 46A. The electrode layer 47 has a configuration similar to that of the above-described electrode layer 17.

The electrode layer 49 is provided in contact with the top surface of the semiconductor layer 41. The electrode layer 49 has an opening 49A corresponding to the light output surface 41A of the semiconductor layer 41. The opening 49A takes, for example, a circular shape. A diameter of the opening 49A is greater than a diameter of the opening 46A, and is, for example, at least 2 μm but no more than 100 μm. The electrode layer 49 has a configuration similar to that of the above-described electrode layer 19.

The multi-layer film reflecting mirror 48 is in contact with a portion of the undersurface of the electrode layer 47, and is embedded in the electrode layer 51. For example, when viewed from the direction of the optical axis AX1 of the surface-emitting laser 2, the multi-layer film reflecting mirror 48 takes a rectangular, polygonal, circular, or elliptical shape. The multi-layer film reflecting mirror 48 is a dielectric multi-layer film reflecting mirror that functions as the DBR. Here, the dielectric multi-layer film reflecting mirror configuring the multi-layer film reflecting mirror 48 has a configuration similar to that of the dielectric multi-layer film reflecting mirror configuring the above-described multi-layer film reflecting mirror 18.

The electrode layer 51 serves to fill a gap around the multi-layer film reflecting mirror 48, and to electrically couple the electrode layer 47 and the junction layer 52 with each other. The electrode layer 51 has a configuration similar to that of the above-described electrode layer 21. The junction layer 52 serves to fix the multi-layer film reflecting mirror 48 to the support substrate 53, and to electrically couple the electrode layer 51 and the support substrate 53 with each other. The junction layer 52 has a configuration similar to that of the above-described junction later 22. The support substrate 53 serves to support a laser element section 40A in a manufacturing process of the laser element section 40, and to electrically couple the junction layer 52 and the electrode layer 54 with each other. The support substrate 53 has a configuration similar to that of the support substrate 23. The electrode layer 54 serves to electrically couple the laser element section 40 to the sub-mount 30. The electrode layer 54 has a configuration similar to that of the electrode layer 24.

[Manufacturing Method]

Next, with reference to FIGS. 10A to 10F, the description is provided of a method of manufacturing the surface-emitting laser 1. FIG. 10A is a cross-sectional view of an example of a manufacturing process of the surface-emitting laser 2. FIG. 10B is a cross-sectional view of an example of the manufacturing process following on the process illustrated in FIG. 10A. FIG. 10C is a cross-sectional view of an example of the manufacturing process following on the process illustrated in FIG. 10B. FIG. 10D is a cross-sectional view of an example of the manufacturing process following on the process illustrated in FIG. 10C. FIG. 10E is a cross-sectional view of an example of the manufacturing process following on the process illustrated in FIG. 10D. FIG. 10F is a cross-sectional view of an example of the manufacturing process following on the process illustrated in FIG. 10E.

Here, the description is provided on a case where the component parts including the semiconductor layer 43A, the semiconductor layer 44, the semiconductor layer 45, the current constriction layer 46, the electrode layer 47, and the multi-layer film reflecting mirror 48 are formed sequentially on a substrate 80 that is an n-type GaN substrate. First, the semiconductor layer 43A, the semiconductor layer 44, and the semiconductor layer 45 are formed on the substrate 80 that is the n-type GaN substrate with use of, for example, the MOCVD process (FIG. 10A).

Next, the current constriction layer 46 having the opening 46A is formed on the semiconductor layer 45 (FIG. 10B). Thereafter, the electrode layer 47 is formed that comes in contact with a surface of the semiconductor layer 45 that is exposed from the opening 46A, and a surface around the opening 46A of the current constriction layer 46 using, for example, the liftoff process. Afterward, the multi-layer film reflecting mirror 48 is formed on a surface of the electrode layer 47, and in a region including a region immediately above the opening 46A. In such a manner, the laser element section 40A illustrated in FIG. 10B is formed.

Further, the electrode layer 51, the junction layer 52, the support substrate 53, and the electrode layer 54 are formed as necessary. For example, a support module 50 in which the electrode layer 51 and the junction layer 52 are formed on one side of the support substrate 53, and the electrode layer 54 is formed on the other side of the support substrate 53 is fixed to the laser element section 40A with the side of the electrode layer 51 faced toward the side of the multi-layer film reflecting mirror 48.

Next, a rear surface of the substrate 80 is ground with use of the CMP, mechanical grinding, photoelectrochemical etching, etc. to remove the substrate 80 (FIG. 10C). Further, the semiconductor layer 43A is ground down to a predetermined thickness with use of the CMP, mechanical grinding, photoelectrochemical etching, etc. For example, the semiconductor layer 43A is ground in such a manner that a distance between the multi-layer film reflecting mirror 48 and the multi-layer film reflecting mirror 42 to be formed later becomes 10 μm or less, for example. As a result, the semiconductor layer 43 having a thickness adjusted to the predetermined thickness is formed. Thereafter, the multi-layer film reflecting mirror 42 is formed on the surface (polished surface) of the semiconductor layer 43 (FIG. 10D). Specifically, the multi-layer film reflecting mirror 42 is formed through the selective etching after forming a dielectric multi-layer film reflecting mirror over the whole region of the top surface of the semiconductor layer 43. At this time, an exposed surface of the semiconductor layer 43 is left around the multi-layer film reflecting mirror 42. Next, a semiconductor layer 41B is formed with use of a method employing the epitaxial growth in the lateral direction, such as the ELO process, using the multi-layer film reflecting mirror 42 as a mask (FIG. 10E). Continuously, the semiconductor layer 41 into which the multi-layer film reflecting mirror 42 is embedded is formed with use of the method employing the epitaxial growth in the lateral direction, such as the ELO process, using the multi-layer film reflecting mirror 42 as a mask (FIG. 10F). At this time, formation of the semiconductor layer 41 is stopped once a thickness of the semiconductor layer 41 reaches the desired thickness.

Thereafter, the electrode layer 49 having the opening 49A is formed on the semiconductor layer 41A. At this time, the opening 49A is formed inside a region facing the multi-layer film reflecting mirror 42. In such a manner, the laser element section 40 is formed. Finally, as necessary, the laser element section 40 is fixed to the sub-mount section 30 with the multi-layer film reflecting mirror 48 faced downward. Thus, the surface-emitting laser 2 is manufactured.

Next, the description is provided of the effects of the surface-emitting laser 2.

In the surface-emitting laser 2, the semiconductor layer 41 is provided between the multi-layer film reflecting mirror 42 and the light output surface 41A. This allows the top surface of the semiconductor layer 41 to serve as the light output surface 41A of the laser element section 40, which makes it possible to accurately determine a position of the light output surface 41A in the thickness direction by adjusting a thickness of the semiconductor layer 41, for example. Further, it is possible to provide the optical elements including, for example, the lens and connection terminals of the optical fiber on the top surface of the semiconductor layer 41, which allows the positions of the above-described optical elements within the light output surface 41A to be determined accurately. Accordingly, it is possible to accurately determine the positions of the above-described optical elements within the light output surface 41A, or the position of the light output surface 41A in the thickness direction.

4. Modification Examples of Second Embodiment

Next, the description is provided of modification examples of the second embodiment. It is to be noted that any component parts common to those in the above-described second embodiment are hereinafter denoted with the same reference numerals. Further, descriptions on the component parts common to those in the above-described second embodiment are omitted as appropriate.

Modification Example C

In the above-described second embodiment, the top surface of the semiconductor layer 41 is a flat surface; however, a convex mesa portion 41C may be provided on the top surface of the semiconductor layer 41, as illustrated in FIG. 11, for example. FIG. 11 illustrates a modification example of a cross-sectional configuration of the surface-emitting laser 2 according to the above-described second embodiment.

A top surface of the mesa portion 41C serves as the light output surface 41A, and the electrode layer 49 is provided in a region corresponding to a base of the mesa portion 41C. In the present modification example, in a manufacturing process, after the light output surface 41A is first formed, the mesa portion 41C is formed. This makes it possible to accurately determine the positions of the above-described optical elements within the light output surface 41A, or the position of the light output surface 41A in the thickness direction, as with the case of the above-described second embodiment.

Modification Example D

In the above-described second embodiment and modification example C, the light output surface 41A may be provided to avoid a central portion of the multi-layer film reflecting mirror 42, as illustrated in FIGS. 12 and 13, for example. Each of FIGS. 12 and 13 illustrates a modification example of a top-side configuration of the surface-emitting laser 2 according to the above-described second embodiment. In FIG. 12, the electrode layer 49 is formed over the whole region of the top surface with the exception of the opening 49A. In FIG. 13, the electrode layer 49 includes an annular portion surrounding the opening 49A, a rectangular pad portion, and a coupling portion that couples the annular portion and the pad portion with each other.

Immediately above the central portion of the multi-layer film reflecting mirror 42 on the semiconductor layer 41, there exists a singularity (a region with a high defect density) that is formed by lateral crystal growth through the use of the ELO, etc. In a case where the light output surface 41A includes the singularity, it is likely that the emission efficiency will deteriorate. Accordingly, as described in the present modification example, in a case where the light output surface 41A is provided to avoid the central portion of the multi-layer film reflecting mirror 42, it is possible to avoid deterioration in the emission efficiency that is caused due to the singularity.

5. Modification Examples Common to Respective Embodiments

Modification Example E

In each of the above-described embodiments, and the modification examples A to D, the light output surface 11A or 41A may be provided at a position where it is difficult for the light output surface 11A or 41A to function as the external resonator mirror. In such a case, the surface-emitting laser 1 or 2 oscillates at the oscillation wavelength $\lambda o$ to output a laser beam at the oscillation wavelength $\lambda o$.

In the present modification example, with the exception that the position of the light output surface 11A or 41A is different from the position of the light output surface 11A or 41A in each of the above-described embodiments, and any of the modification examples A to D, any other configuration is common to that in each of the above-described embodiments, and any of the modification examples A to D. Therefore, also in the present modification example, it is possible to achieve effects similar to those obtained in each of the above-described embodiments, and the modification examples A to D.

Modification Example F

In the above-described first embodiment, and the modification examples A, B, and E, the surface-emitting laser 1 may include a concave portion 11C at a position facing the opening 19A (on the light output surface 11A) on the top surface of the semiconductor layer 11, as illustrated in FIG. 14, for example. Similarly, in the above-described second embodiment, and the modification examples C, D, and E, the surface-emitting laser 2 may include a concave portion 41C at a position facing the opening 49A (on the light output surface 41A) on the top surface of the semiconductor layer 41, as illustrated in FIG. 14, for example.

The concave portion 11C or 41D is provided to ensure that a central axis AX2 of the concave portion 11C or 41D overlaps with the optical axis AX1 of the surface-emitting laser 1 or 2, respectively. For example, as illustrated in FIG. 15, the concave portion 11C or 41D is provided in such a manner that a resist layer 91 having a predetermined opening is respectively formed on the top surface of the semiconductor layer 11 or 41, and thereafter etching is performed selectively for the semiconductor layer 11 or 41 (the light output surface 11A or 41A) respectively through the opening of the resist layer 91. The etching may be either dry etching or wet etching. The opening of the resist layer 91 is provided at a predetermined position of the resist layer 91 with reference to a marker that is formed inside the same layer as the electrode layers 17 and 47 in a manufacturing process, for example. The above-described marker serves to specify an in-plane reference position, and includes, for example, a metallic material.

In the present modification example, the concave portion 11C or 41D is provided by etching, on the light output surface 11A or 41A, respectively. The etching of the light output surface 11A or 41A is carried out through the opening, of the resist layer 91, that is provided with reference to the marker specifying the in-plane reference position. This makes it possible to provide the concave portion 11C or 41D accurately at an in-plane predetermined position. Therefore, the present modification example allows for easy alignment of the central axis AX2 of the concave portion 11C or 41D with the optical axis AX1 of the surface-emitting laser 1 or 2, respectively.

Meanwhile, as a contributing factor that allows for the easy alignment of the central axis AX2 of the concave portion 11C or 41D with the optical axis AX1 of the surface-emitting laser 1 or 2, there is another contributing factor other than the above-describe marker. It is very difficult to accurately provide the above-described concave portion 11C or 41D at an in-plane predetermined position on an uneven surface on which a bare multi-layer film reflecting mirror is formed. In contrast, in the present modification example, the top surface of the semiconductor layer 11 or 41 respectively in forming the concave portion 11C or 41D is flat. This makes it possible to accurately provide the opening of the resist layer 91 at a predetermined position on the top surface of the semiconductor layer 11 or 41. As a result, this allows for the easy alignment of the central axis AX2 of the concave portion 11C or 41D with the optical axis AX1 of the surface-emitting laser 1 or 2, respectively.

As described above, in the present modification example, the concave portion 11C or 41D is provided that has the central axis AX2 overlapping with the optical axis AX1 of the surface-emitting laser 1 or 2, respectively. For example, this allows an optical axis AX3 of a tip portion of an optical fiber 60 to be described later to overlap with the optical axis AX1 of the surface-emitting laser 1 or 2 by simply inserting the tip portion of the optical fiber 60 into the concave portion 11C or 41D. As a result, it is possible to reduce optical coupling loss between the surface-emitting laser 1 or 2 and the optical fiber 60.

Modification Example G

In the above-described modification example F, the surface-emitting laser 1 may further include the optical fiber 60 that is coupled to the concave portion 11C or 41D, as illustrated in FIG. 16, for example. The optical axis AX3 of the tip portion of the optical fiber 60 overlaps with the optical axis AX1 of the surface-emitting laser 1 or 2. This is because the central axis AX2 of the concave portion 11C or 41D overlaps with the optical axis AX1 of the surface-emitting laser 1 or 2 respectively, and the optical axis AX3 of the tip portion of the optical fiber 60 overlaps with the optical axis AX1 of the surface-emitting laser 1 or 2 when the tip portion of the optical fiber 60 is inserted into the concave portion 11C or 41D. In such a manner, in the present modification example, the optical axis AX3 of the tip portion of the optical fiber 60 overlaps with the optical axis AX1 of the surface-emitting laser 1 or 2. This makes it possible to reduce the optical coupling loss between the surface-emitting laser 1 or 2 and the optical fiber 60.

Modification Example H

In the above-described first embodiment, and the modification examples A, B, and E, the surface-emitting laser 1 may include a convex lens 70 at a position facing the opening 19A (on the light output surface 11A) on the top surface of the semiconductor layer 11, as illustrated in FIG. 17, for example. Similarly, in the above-described second embodiment, and the modification examples C, D, and E, the surface-emitting laser 2 may include the convex lens 70 at a position facing the opening 49A (on the light output surface 41A) on the top surface of the semiconductor layer 41, as illustrated in FIG. 17, for example.

The lens 70 is disposed in contact with the light output surface 11 or 41A. The lens 70 is disposed in such a manner that an optical axis AX4 of the lens 70 overlaps with the optical axis AX1 of the surface-emitting laser 1 or 2. It is to be noted that, in the present modification example, the light output surface of the laser element section 10 or 40 is also referred to as a surface of the lens 70.

The lens 70 is formed in the following manner, for example. First, an insulating layer 71 including a material such as $SiO_2$ is formed over the whole region of the top surface of the semiconductor layer 11 or 41, as illustrated in FIG. 18, for example. Next, a convex resist layer 92 is formed in a region facing the light output surface 11A or 41A on the top surface of the insulating layer 71. The convex resist layer 92 is formed, for example, by heating a photoresist, or utilizing surface tension of the photoresist. Thereafter, etching is performed on the convex resist layer 92 and the insulating layer 71. The etching may be either dry etching or wet etching. In such a manner, the lens 70 is formed. The resist layer 92 is formed at a predetermined position of the insulating layer 71 with reference to the marker that is formed inside the same layer as the electrode layers 17 and 47 in a manufacturing process, for example. The above-described marker serves to specify an in-plane reference position, and includes, for example, a metallic material.

In the present modification example, the convex lens 70 is formed on the surface of the light output surface 11A or 41A through etching of the convex resist layer 92 and the insulating layer 71. The etching of the insulating layer 71 is carried out using the convex resist layer 92 that is formed with reference to the marker specifying the in-plane reference position as a mask. This makes it possible to form the convex lens 70 accurately at an in-plane predetermined position. Therefore, the present modification example allows for easy alignment of the optical axis AX4 of the convex lens 70 with the optical axis AX1 of the surface-emitting laser 1 or 2.

Meanwhile, as a contributing factor that allows for the easy alignment of the optical axis AX4 of the convex lens 70 with the optical axis AX1 of the surface-emitting laser 1 or 2, there is another contributing factor other than the above-describe marker. It is very difficult to accurately form the convex resist layer 92 at an in-plane predetermined position on an uneven surface on which a bare multi-layer film reflecting mirror is formed. In contrast, in the present modification example, the top surface of the insulating layer 71 (or the semiconductor layer 11 or 41) in forming the convex resist layer 92 is flat. This makes it possible to accurately form the convex resist layer 92 at a predetermined position on the top surface of the insulating layer 71. As a result, this allows for the easy alignment of the optical axis AX4 of the convex lens 70 with the optical axis AX1 of the surface-emitting laser 1 or 2.

As described above, in the present modification example, the convex lens 70 is provided that has the central axis AX4 overlapping with the optical axis AX1 of the surface-emitting laser 1 or 2. Therefore, at the time of emission from the surface-emitting laser 1 or 2, it is possible for the optical axis AX4 of the convex lens 70 to overlap with the optical axis of light emitted from the surface-emitting laser 1 or 2.

As a result, it is possible to reduce the optical coupling loss between the surface-emitting laser 1 or 2 and the convex lens 70.

It is to be noted that, in the present modification example, the lens 70 may be formed using a nanoimprint technique. First, a mold is prepared that includes a material having light transmission characteristics, such as quartz. In the mold, a curved hollow corresponding to the convex lens 70 is provided. Next, after a photo-curable resist is applied on the insulating layer 71, the above-described mold is pressed against the photo-curable resist to fill the hollow of the above-described mold with the photo-curable resist. At this time, for example, a position of the above-described mold is determined with reference to the marker specifying the in-plane reference position. Thereafter, ultraviolet light is applied toward the hollow of the above-described mold. This leads to formation of the convex lens 70. As described above, also in a case where the lens 70 is formed using the nanoimprint technique, it is possible to accurately dispose the above-described mold at an in-plane predetermined position, which allows for easy fabrication of the convex lens 70 having the optical axis AX4 that overlaps with the optical axis AX1 of the surface-emitting laser 1 or 2. It is to be noted that a thermosetting resin may be used instead of the photo-curable resist. In such a case, heat may be applied instead of irradiation of the ultraviolet light.

Modification Example I

In the above-described first embodiment, and the modification examples A, B, and E, the semiconductor layer 11 may include a lens 72 at a position facing the opening 19A (on the light output surface 11A) on the top surface of the semiconductor layer 11, as illustrated in FIG. 19, for example. Similarly, in the above-described second embodiment, and the modification examples C, D, and E, the semiconductor layer 41 may include the lens 72 at a position facing the opening 49A (on the light output surface 41A) on the top surface of the semiconductor layer 41, as illustrated in FIG. 19, for example.

The lens 72 is formed on the semiconductor layer 11 or 41 in such a manner that an optical axis AX5 of the lens 72 overlaps with the optical axis AX1 of the surface-emitting laser 1 or 2. The lens 72 is a zone plate lens, and has a plurality of concentric ring-like grooves 73 that function as a lens, as illustrated in FIGS. 19 and 20, for example. Each of the grooves 73 is provided inside the light output surface 11A, and functions as a diffracting grating. It is to be noted that, in the present modification example, the light output surface of the laser element section 10 or 40 is also referred to as a surface of the lens 72.

The lens 72 is formed in the following manner, for example. First, a resist layer 93 is formed over the whole region of the top surface of the semiconductor layer 11 or 41, and thereafter a plurality of concentric openings are provided at predetermined positions of the resist layer 93, as illustrated in FIG. 21, for example. Next, etching is performed selectively on the semiconductor layer 11 or 41 (the light output surface 11A or 41A) through each of the openings of the resist layer 93. The etching may be either dry etching or wet etching. In such a manner, the lens 72 is formed. Each of the openings of the resist layer 93 is formed at a predetermined position of the resist layer 93 with reference to the marker that is formed inside the same layer as the electrode layers 17 and 47 in a manufacturing process, for example. The above-described marker serves to specify an in-plane reference position, and includes, for example, a metallic material.

In the present modification example, the lens 72 is formed through etching on the light output surface 11A or 41A. The etching of the light output surface 11A or 41A is carried out through each of the openings of the resist layer 93 that are provided with reference to the marker specifying the in-plane reference position. This makes it possible to provide a plurality of concave portions 73 accurately at in-plane predetermined positions. Therefore, the present modification example allows for easy alignment of the optical axis AX5 of the lens 72 with the optical axis AX1 of the surface-emitting laser 1 or 2.

Meanwhile, as a contributing factor that allows for the easy alignment of the optical axis AX5 of the lens 72 with the optical axis AX1 of the surface-emitting laser 1 or 2, there is another contributing factor other than the above-describe marker. It is very difficult to accurately form the above-described concave portion 11C or 41D at an in-plane predetermined position on an uneven surface on which a bare multi-layer film reflecting mirror is formed. In contrast, in the present modification example, the top surface of the semiconductor layer 11 or 41 in forming the lens 72 is flat. This makes it possible to accurately provide the openings of the resist layer 93 at predetermined positions on the top surface of the semiconductor layer 11 or 41. As a result, this allows for the easy alignment of the optical axis AX5 of the lens 72 with the optical axis AX1 of the surface-emitting laser 1 or 2.

As described above, in the present modification example, the lens 72 is provided that has the optical axis AX5 overlapping with the optical axis AX1 of the surface-emitting laser 1 or 2. Therefore, at the time of emission from the surface-emitting laser 1 or 2, it is possible for the optical axis AX5 of the lens 72 to overlap with the optical axis of light emitted from the surface-emitting laser 1 or 2. As a result, it is possible to reduce the optical coupling loss between the surface-emitting laser 1 or 2 and the convex lens 72.

Modification Example J

In the above-described modification example I, the semiconductor layer 11 or 41 may include a lens 74 instead of the lens 72, as illustrated in FIG. 22, for example. The lens 74 is a Fresnel lens, and has a plurality of concentric ring-like grooves 75 that function as a lens, as illustrated in FIG. 22, for example. It is to be noted that, in the present modification example, the light output surface of the laser element section 10 or 40 is also referred to as a surface of the lens 74. Each of the grooves 75 is provided inside the light output surface 11A. A cross-sectional shape of the lens 74 is saw-toothed. The lens 74 is formed in a manner similar to that of the lens 72. This allows for the easy alignment of an optical axis AX6 of the lens 74 with the optical axis AX1 of the surface-emitting laser 1 or 2.

Modification Example K

In the above-described first embodiment, and the modification examples A, B, and E, the semiconductor layer 11 may include a convex lens 76 at a position facing the opening 19A (on the light output surface 11A) on the top surface of the semiconductor layer 11, as illustrated in FIG. 23, for example. Similarly, in the above-described second embodiment, and the modification examples C, D, and E, the semiconductor layer 41 may include the convex lens 76 at a position facing the opening 49A (on the light output surface 41A) on the top surface of the semiconductor layer 41, as illustrated in FIG. 23, for example.

The lens 76 is formed on the semiconductor layer 11 or 41 in such a manner that an optical axis AX7 of the lens 76 overlaps with the optical axis AX1 of the surface-emitting laser 1 or 2. It is to be noted that, in the present modification example, the light output surface of the laser element section 10 or 40 is also referred to as a surface of the lens 76.

The lens 76 is formed in the following manner, for example. First, a convex resist layer 94 is formed in a region facing the light output surface 11A or 41A on the top surface of the semiconductor layer 11 or 41, as illustrated in FIG. 24, for example. The convex resist layer 94 is formed, for example, by heating a photoresist, or utilizing surface tension of the photoresist. Thereafter, etching is performed on the convex resist layer 94 and the semiconductor layer 11 or 41. The etching may be either dry etching or wet etching. In such a manner, the lens 76 is formed. The resist layer 94 is formed at a predetermined position of the light output surface 11A or 41A with reference to the marker that is formed inside the same layer as the electrode layers 17 and 47 in a manufacturing process, for example. The above-described marker serves to specify an in-plane reference position, and includes, for example, a metallic material.

In the present modification example, the convex lens 76 is formed on the surface of the light output surface 11A or 41A through etching of the convex resist layer 94. The etching of the semiconductor layer 11 or 41 is carried out using the convex resist layer 94 that is formed with reference to the marker specifying the in-plane reference position as a mask. This makes it possible to form the convex lens 76 accurately at an in-plane predetermined position. Therefore, the present modification example allows for easy alignment of the optical axis AX7 of the convex lens 76 with the optical axis AX1 of the surface-emitting laser 1 or 2.

Meanwhile, as a contributing factor that allows for the easy alignment of the optical axis AX7 of the convex lens 76 with the optical axis AX1 of the surface-emitting laser 1 or 2, there is another contributing factor other than the above-describe marker. It is very difficult to accurately form the convex resist layer 94 at an in-plane predetermined position on an uneven surface on which a bare multi-layer film reflecting mirror is formed. In contrast, in the present modification example, the top surface of the semiconductor layer 11 or 41 in forming the convex resist layer 94 is flat. This makes it possible to accurately form the convex resist layer 94 at a predetermined position on the top surface of the semiconductor layer 11 or 41. As a result, this allows for the easy alignment of the optical axis AX7 of the convex lens 76 with the optical axis AX1 of the surface-emitting laser 1 or 2.

As described above, in the present modification example, the convex lens 76 is provided that has the central axis AX7 overlapping with the optical axis AX1 of the surface-emitting laser 1 or 2. Therefore, at the time of emission from the surface-emitting laser 1 or 2, it is possible for the optical axis AX7 of the convex lens 76 to overlap with the optical axis of light emitted from the surface-emitting laser 1 or 2. As a result, it is possible to reduce the optical coupling loss between the surface-emitting laser 1 or 2 and the convex lens 76.

Modification Example L

In the above-described first embodiment, and the modification examples A, B, and E, the semiconductor layer 11 may include a pinhole layer 77 in which an opening 77A is provided at a position facing the opening 19A (on the light output surface 11A) on the top surface of the semiconductor layer 11, as illustrated in FIGS. 25 and 26, for example. Similarly, in the above-described second embodiment, and the modification examples C, D, and E, the semiconductor layer 41 may include the pinhole layer 77 in which the opening 77A is provided at a position facing the opening 49A (on the light output surface 41A) on the top surface of the semiconductor layer 41, as illustrated in FIG. 26, for example. In other words, in the present modification example, the pinhole layer 77 is disposed outside internal resonators (the multi-layer film reflecting mirrors 12 and 18, or the multi-layer film reflecting mirrors 22 and 28), and on the top surface of the semiconductor layer 11 or 41.

The pinhole layer 77 diffracts light outputted from the active layer 13 or 43 at the opening 77A with the help of the diffractive effect obtained by the opening 77A. A diameter of the opening 77A is a size that ensures to generate diffraction for light emitted from the surface-emitting laser 1 or 2, and is ten or less times greater than a diameter of the current injection region 15A or 45A, for example.

Further, the pinhole layer 77 serves to block resonance of the light outputted from the active layer 13 or 43 at a portion other than the opening 77A in the pinhole layer 77. Specifically, the pinhole layer 77 serves to attenuate a high-order lateral mode included in the light outputted from the active layer 13 or 43 at the portion other than the opening 77A in the pinhole layer 77. Preferably, the pinhole layer 77 is disposed at a position corresponding to a portion of the side of a standing wave that is generated by the multi-layer film reflecting mirrors 12 and 18, or the multi-layer film reflecting mirrors 22 and 28. The pinhole layer 77 includes, for example, a material absorbing light emitted from the surface-emitting laser 1 or 2, or a material having refractive index ensuring that a portion in contact with the pinhole layer 77 of the light output surface 11A or 41A has difficulty in functioning as an external resonator mirror. The pinhole layer 77 may have a film thickness ensuring that the portion in contact with the pinhole layer 77 of the light output surface 11A or 41A has difficulty in functioning as the external resonator mirror.

The pinhole layer 77 includes, for example, a material such as ITO or SiN. The pinhole layer 77 may include a conductive material. In such a case, the pinhole layer 77 may be provided between the semiconductor layer 11 or 41 and the electrode layer 13 or 49, respectively, as illustrated in FIG. 25, for example. The pinhole layer 77 may include an insulating material. In such a case, the pinhole layer 77 is provided to avoid the region between the semiconductor layer 11 or 41 and the electrode layer 13 or 49, respectively, as illustrated in FIG. 26, for example.

A diameter of the opening 77A is set on the basis of distribution of the high-order lateral mode to be attenuated, for example. The diameter of the opening 77A is greater than a diameter of the current injection region 15A or 45A. In a case where the diameter of the current injection region 15A or 45A is, for example, about 8 μm, the diameter of the opening 77A is, for example, about 8.5 μm.

The pinhole layer 77 is formed in the following manner, for example. First, a pinhole material layer 77B that includes the same material as the pinhole layer 77 is formed over the whole region of the top surface of the semiconductor layer 11 or 41, as illustrated in FIG. 27, for example. Next, a resist layer 95 having an opening 95A is formed in a region facing the light output surface 11A or 41A on the top surface of the pinhole material layer 77B. Thereafter, etching is performed on the pinhole material layer 77B through the opening 95A. The etching may be either dry etching or wet etching. In such a manner, the pinhole layer 77 is formed. The opening 95A is provided at a predetermined position of the resist layer 95 with reference to the marker that is formed inside the same layer as the electrode layers 17 and 47 in a manufacturing process, for example. The above-described marker serves to specify an in-plane reference position, and includes, for example, a metallic material.

In the present modification example, the pinhole layer 77 is formed on the surface of the light output surface 11A or 41A through etching of the pinhole material layer 77B. The etching of the pinhole material layer 77B is carried out using the resist layer 95 that is formed with reference to the marker specifying the in-plane reference position as a mask. This makes it possible to provide the opening 77A accurately at an in-plane predetermined position. Therefore, the present modification example allows for easy alignment of a central axis AX8 of the opening 77A with the optical axis AX1 of the surface-emitting laser 1 or 2.

Meanwhile, as a contributing factor that allows for the easy alignment of the central axis AX8 of the opening 77A with the optical axis AX1 of the surface-emitting laser 1 or 2, there is another contributing factor other than the above-describe marker. It is very difficult to accurately provide the opening 77A at an in-plane predetermined position on an uneven surface on which a bare multi-layer film reflecting mirror is formed. In contrast, in the present modification example, the top surface of the pinhole material layer 77B (the semiconductor layer 11 or 41) in providing the opening 77A is flat. This makes it possible to accurately provide the opening 95A at a predetermined position on the top surface of the pinhole material layer 77B, which also allows the opening 77A that is provided through the opening 95A to be accurately formed at a predetermined position on the top surface of the semiconductor layer 11 or 41. As a result, this allows for the easy alignment of the central axis AX8 of the opening 77A with the optical axis AX1 of the surface-emitting laser 1 or 2.

As described above, in the present modification example, the opening 77A is provided that has the central axis AX8 overlapping with the optical axis AX1 of the surface-emitting laser 1 or 2. Therefore, at the time of emission from the surface-emitting laser 1 or 2, this allows the central axis AX8 of the opening 77A to overlap with the optical axis of light emitted from the surface-emitting laser 1 or 2. As a result, it is possible to control a divergent angle of light emitted from the surface-emitting laser 1 or 2 within the desired range.

Further, in the present modification example, the pinhole layer 77 is disposed outside the internal resonator, which makes it easier to form the pinhole layer 77 as compared with a case where the pinhole layer 77 is disposed inside the internal resonator, and further which makes it possible to suppress a rise in a threshold voltage, or deterioration in the slope efficiency. In addition, in the present modification example, the pinhole layer 77 is disposed on the top surface of the semiconductor layer 11 or 41, and therefore it is possible to dispose the pinhole layer 77 at a position corresponding to a portion of the side of the standing wave that is generated by the multi-layer film reflecting mirrors 12 and 18, or the multi-layer film reflecting mirrors 22 and 28, by controlling the thickness of the semiconductor layer 11 or 41.

Further, in the present modification example, the pinhole layer 77 has a function of not only controlling the divergent angle, but also attenuating the high-order lateral mode. This makes it possible to achieve a more simplified layer structure of the surface-emitting laser 1 or 2 as compared with a case where each of the above-described functions is provided separately.

The technology is described thus far with reference to the embodiments and the modification examples thereof; however, the technology is not limited to the above-described embodiments, etc., and various modifications may be made. It is to be noted that the effects described herein are merely exemplified. The effects of the technology are not limited to the effects described herein. The technology may have any effect other than the effects described herein.

Modification Example M

In each of the above-described embodiments, and the modification examples thereof, an antireflective film or a protective film may be provided on the light output surface 11A or 41A.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

Further, for example, the technology may be configured as follows.

(1)

A surface-emitting laser including:

a laser element section that includes a first multi-layer film reflecting mirror, a first semiconductor layer of a first conductivity type, an active layer, a second semiconductor layer of a second conductivity type, a second multi-layer film reflecting mirror, a nitride semiconductor layer of the second conductivity type, and a light output surface in this order, the laser element section further including an electrode that injects a current into the active layer.

(2)

The surface-emitting laser according to (1), in which the laser element section has a current constriction layer provided with a first opening, the first opening constricting the current to be injected into the active layer, and the light output surface is provided at a position facing the first opening.

(3)

The surface-emitting laser according to (1) or (2), in which the electrode includes a first electrode that is in contact with the nitride semiconductor layer, and a second electrode that is in contact with the first semiconductor layer through the first opening.

(4)

The surface-emitting laser according to any one of (1) to (3), in which the light output surface is provided at a position at which the light output surface functions as an external resonator mirror.

(5)

The surface-emitting laser according to any one of (1) to (3), in which the nitride semiconductor layer has a concave portion at a position facing the first opening on a top surface of the nitride semiconductor layer, and an undersurface of the concave portion is the light output surface.

(6)
The surface-emitting laser according to (5), further including an optical fiber whose tip is coupled to the concave portion.

(7)
The surface-emitting laser according to any one of (1) to (3), further including a lens that is in contact with the light output surface.

(8)
The surface-emitting laser according to any one of (1) to (3), in which the nitride semiconductor layer has a plurality of concentric ring-like grooves on the light output surface, the plurality of concentric ring-like grooves functioning as lenses.

(9)
The surface-emitting laser according to any one of (1) to (3), in which
the nitride semiconductor layer has a convex lens at a position facing the first opening on a top surface of the nitride semiconductor layer, and
a top surface of the convex lens is the light output surface.

(10)
The surface-emitting laser according to any one of (1) to (3), further including a pinhole layer provided with a second opening at a position facing the light output surface, in which
the pinhole layer has a function of diffracting light outputted from the active layer at the second opening, and has a function of blocking resonance of the light outputted from the active layer at a portion other than the second opening.

(11)
The surface-emitting laser according to any one of (1) to (10), in which both of the first multi-layer film reflecting mirror and the second multi-layer film reflecting mirror are dielectric multi-layer film reflecting mirrors.

(12)
The surface-emitting laser according to (11), in which the nitride semiconductor layer is a semiconductor layer that is formed by embedding the second multi-layer film reflecting mirror therein, or a substrate used in formation of the second multi-layer film reflecting mirror.

(13)
The surface-emitting laser according to any one of (1) to (10), in which
the first multi-layer film reflecting mirror is a dielectric multi-layer film reflecting mirror, and
the second multi-layer film reflecting mirror is a nitride-based semiconductor multi-layer film reflecting mirror of the second conductivity type.

(14)
The surface-emitting laser according to (13), in which the nitride semiconductor layer is a substrate used in formation of the second multi-layer film reflecting mirror.

The invention claimed is:

1. A surface-emitting laser comprising:
a laser element section that includes a first multi-layer film reflecting mirror, a first semiconductor layer having a first conductivity type, an active layer, a second semiconductor layer having a second conductivity type, a second multi-layer film reflecting mirror, a nitride semiconductor layer having the second conductivity type, and a light output surface in this order, the laser element section further including a first electrode that injects a current into the active layer,
wherein the first semiconductor layer includes AlGaN, InGaN or AlInGaN, and wherein the first semiconductor layer is provided between the electrode and the active layer, and wherein a first surface of the first semiconductor layer directly contacts with the active layer and at least a portion of a second surface of the first semiconductor layer directly contacts with the first electrode.

2. The surface-emitting laser according to claim 1, wherein
the laser element section has a current constriction layer provided with a first opening, the first opening constricting the current to be injected into the active layer, and
the light output surface is provided at a position facing the first opening.

3. The surface-emitting laser according to claim 2, further comprising a second electrode that is in contact with the nitride semiconductor layer, and wherein the first electrode that is in contact with the first semiconductor layer through the first opening.

4. The surface-emitting laser according to claim 2, wherein the light output surface is provided at a position at which the light output surface functions as an external resonator mirror.

5. The surface-emitting laser according to claim 2, wherein the nitride semiconductor layer has a concave portion at a position facing the first opening on a top surface of the nitride semiconductor layer, and
an undersurface of the concave portion is the light output surface.

6. The surface-emitting laser according to claim 5, further comprising an optical fiber whose tip is coupled to the concave portion.

7. The surface-emitting laser according to claim 2, further comprising a lens that is in contact with the light output surface.

8. The surface-emitting laser according to claim 2, wherein the nitride semiconductor layer has a plurality of concentric ring-like grooves on the light output surface, the plurality of concentric ring-like grooves functioning as lenses.

9. The surface-emitting laser according to claim 2, wherein the nitride semiconductor layer has a convex lens at a position facing the first opening on a top surface of the nitride semiconductor layer, and a top surface of the convex lens is the light output surface.

10. The surface-emitting laser according to claim 2, further comprising a pinhole layer provided with a second opening at a position facing the light output surface, wherein the pinhole layer has a function of diffracting light outputted from the active layer at the second opening, and has a function of blocking resonance of the light outputted from the active layer at a portion other than the second opening.

11. The surface-emitting laser according to claim 2, wherein both of the first multi-layer film reflecting mirror and the second multi-layer film reflecting mirror are dielectric multi-layer film reflecting mirrors.

12. The surface-emitting laser according to claim 11, wherein the nitride semiconductor layer is a semiconductor layer that is formed by embedding the second multi-layer film reflecting mirror therein, or a substrate used in formation of the second multi-layer film reflecting mirror.

13. The surface-emitting laser according to claim 2, wherein the first multi-layer film reflecting mirror is a dielectric multi-layer film reflecting mirror, and the second multi-layer film reflecting mirror is a nitride-based semiconductor multi-layer film reflecting mirror of the second conductivity type.

14. The surface-emitting laser according to claim 13, wherein the nitride semiconductor layer is a substrate used in formation of the second multi-layer film reflecting mirror.

\* \* \* \* \*